United States Patent
Woo et al.

(10) Patent No.: US 11,908,845 B2
(45) Date of Patent: Feb. 20, 2024

(54) DISPLAY DEVICE

(71) Applicant: Samsung Display Co., Ltd., Yongin-si (KR)

(72) Inventors: Min Kyu Woo, Yongin-si (KR); Kyung Bae Kim, Yongin-si (KR); Chong Chul Chai, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 440 days.

(21) Appl. No.: 17/003,428

(22) Filed: Aug. 26, 2020

(65) Prior Publication Data

US 2021/0265329 A1   Aug. 26, 2021

(30) Foreign Application Priority Data

Feb. 21, 2020   (KR) .......................... 10-2020-0021714

(51) Int. Cl.
| | |
|---|---|
| *H01L 29/12* | (2006.01) |
| *H01L 29/786* | (2006.01) |
| *H01L 25/16* | (2023.01) |
| *H01L 33/62* | (2010.01) |
| *H01L 33/60* | (2010.01) |
| *H01L 33/44* | (2010.01) |
| *H01L 33/20* | (2010.01) |

(52) U.S. Cl.
CPC ............ *H01L 25/167* (2013.01); *H01L 33/62* (2013.01); *H01L 33/20* (2013.01); *H01L 33/44* (2013.01); *H01L 33/60* (2013.01)

(58) Field of Classification Search
CPC ....... H01L 25/167; H01L 33/62; H01L 33/20; H01L 33/44; H01L 33/60; H01L 25/0753; H01L 27/156; H01L 25/105; H01L 27/124; H01L 33/48
See application file for complete search history.

(56) References Cited

U.S. PATENT DOCUMENTS

| | | | |
|---|---|---|---|
| 9,871,088 B2 | 1/2018 | Hatano | |
| 2018/0175009 A1* | 6/2018 | Kim | ......................... H01L 33/44 |
| 2019/0251898 A1 | 8/2019 | Cho et al. | |
| 2021/0111323 A1 | 4/2021 | Kim et al. | |
| 2021/0288217 A1* | 9/2021 | Li | ......................... H01L 25/167 |

FOREIGN PATENT DOCUMENTS

| | | |
|---|---|---|
| KR | 10-2019-0077673 A | 7/2019 |
| KR | 10-2019-0098305 A | 8/2019 |
| KR | 10-2021-0044938 A | 4/2021 |

* cited by examiner

*Primary Examiner* — Ismail A Muse
(74) *Attorney, Agent, or Firm* — Lewis Roca Rothgerber Christie LLP

(57) ABSTRACT

A display device includes: a base layer having a first area and a second area extending at least partially around a periphery of the first area; conductive patterns in the second area; an insulating layer over the conductive patterns in the second area; a first electrode and a second electrode on the insulating layer; and a plurality of light emitting elements between the first electrode and the second electrode in the first area and being connected to the first electrode and the second electrode. The first electrode and the second electrode are spaced apart from each other in the first area and are respectively connected to portions of the conductive patterns through contact openings penetrating the insulating layer. The light emitting elements do not overlap the conductive patterns and the insulating layer.

16 Claims, 21 Drawing Sheets

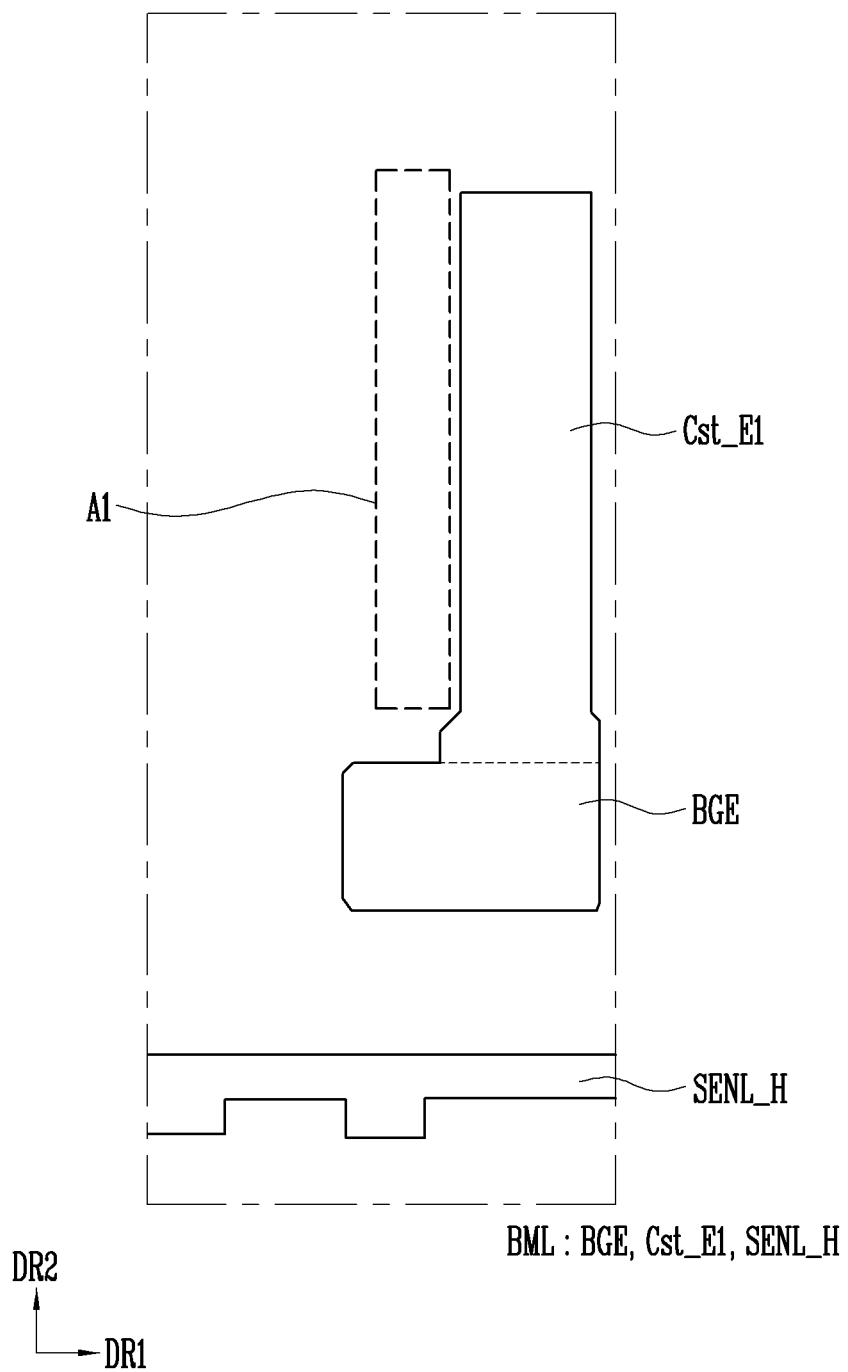

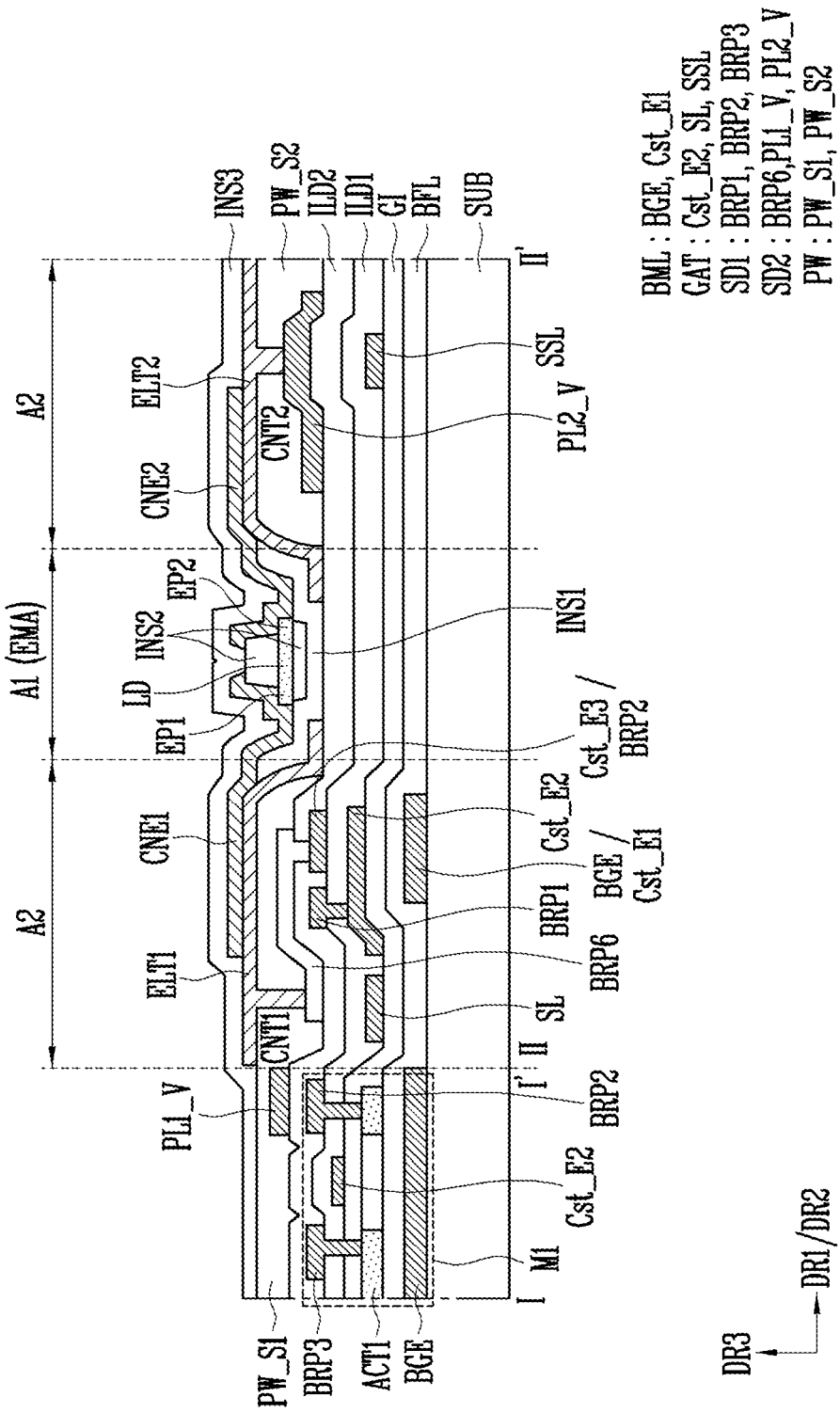

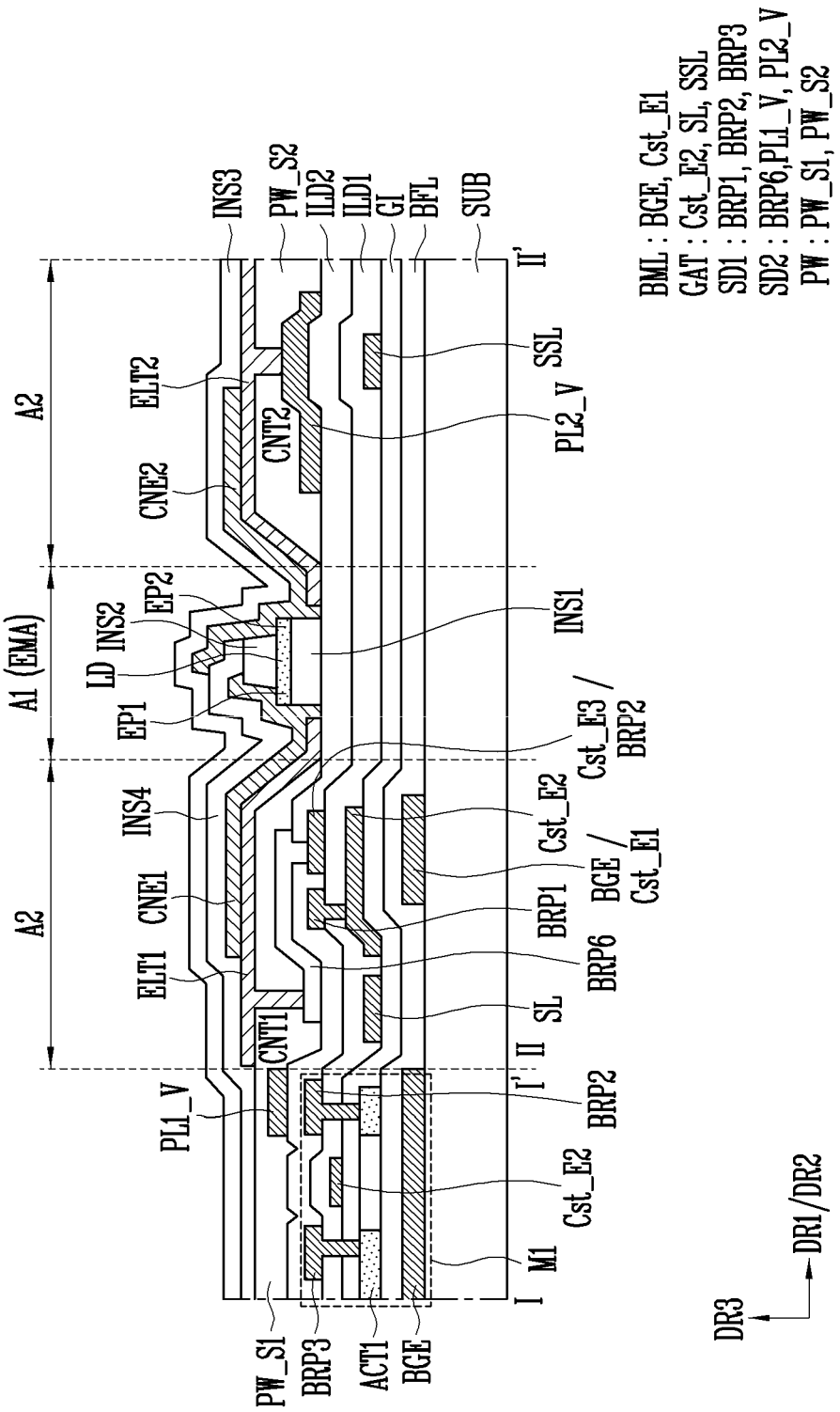

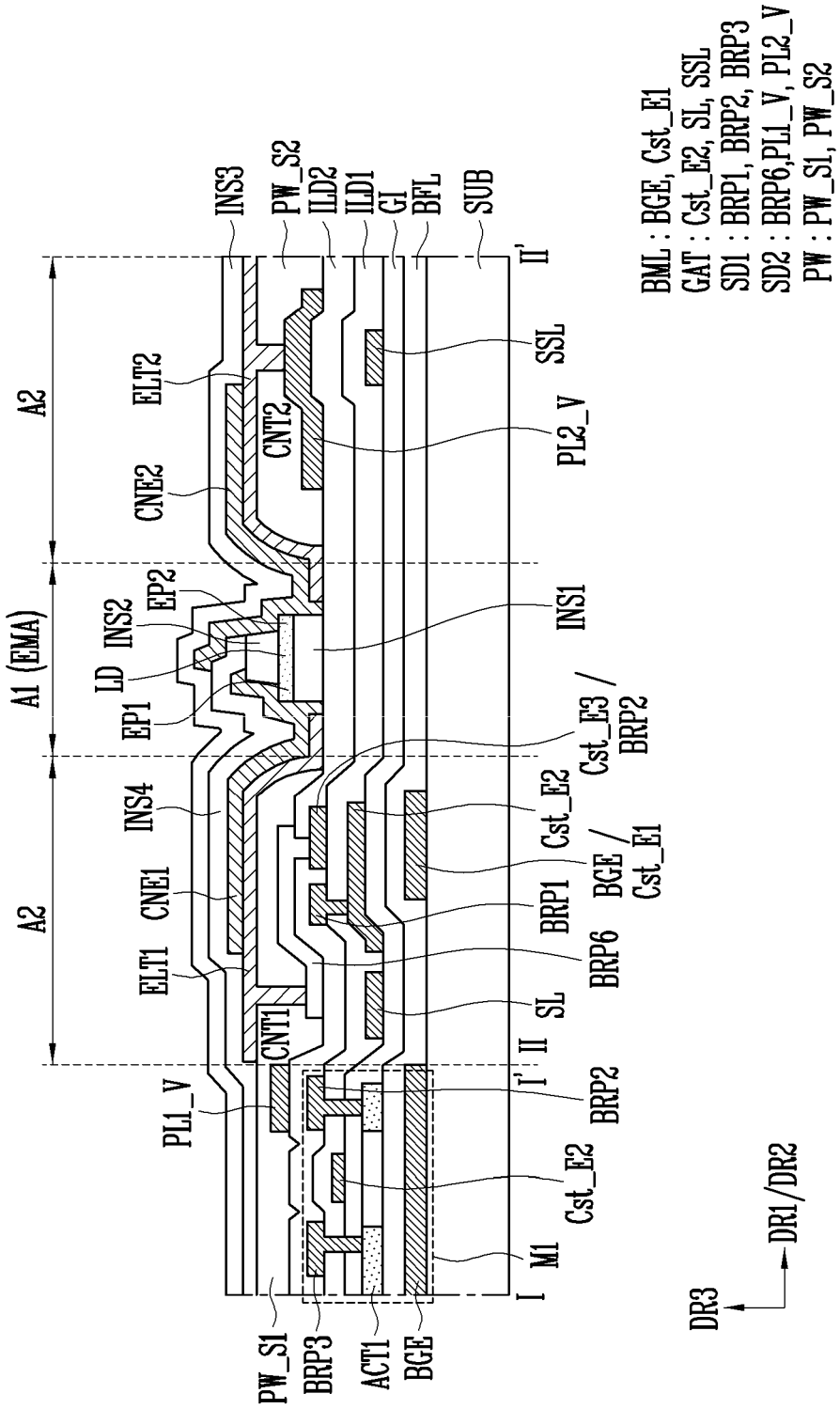

DISPLAY DEVICE

CROSS-REFERENCE TO RELATED APPLICATION

This application claims priority to and the benefit of Korean patent application 10-2020-0021714, filed on Feb. 21, 2020, in the Korean Intellectual Property Office, the entire disclosure of which is incorporated herein by reference.

BACKGROUND

1. Field

Aspects of embodiments of the present disclosure generally relate to a display device.

2. Related Art

Recently, a technique for fabricating a micro light emitting element by using a material having an inorganic crystalline structure with high reliability along with a technique for fabricating a light emitting apparatus by using the light emitting element have been developed. For example, a technique for fabricating a light emitting apparatus by using micro light emitting elements having a size small (e.g., having a size on a micro scale or nano scale) as a light source has been developed. Such a light emitting apparatus can be used for (or used as) various types of electronic devices, such as a display device or an illumination device.

A planarization layer, which planarizes a pixel circuit layer for driving micro light emitting elements, may be formed to align the light emitting elements and bank patterns may be formed on the planarized pixel circuit layer to allow light radiated from the light emitting elements to be emitted to the front. For example, processes for alignment and light emission of the micro light emitting elements may be additionally required, and a fabricating process of a display device may be complicated.

SUMMARY

Embodiments of the present disclosure provide a display device which can be fabricated through a simplified process.

According to an embodiment of the present disclosure, a display device includes: a base layer having a first area and a second area extending at least partially around a periphery of the first area; conductive patterns in the second area; an insulating layer over the conductive patterns in the second area; a first electrode and a second electrode on the insulating layer; and a plurality of light emitting elements between the first electrode and the second electrode in the first area and being connected to the first electrode and the second electrode. The first electrode and the second electrode are spaced apart from each other in the first area and are respectively connected to portions of the conductive patterns through contact openings penetrating the insulating layer. The light emitting elements do not overlap the conductive patterns and the insulating layer.

The display device may further include: a third electrode on the first electrode and on one end portion of the light emitting elements to contact the first electrode and the one end portions of the light emitting elements; and a fourth electrode on the second electrode and on the other end portions of the light emitting elements to contact the second electrode and the other end portions of the light emitting elements.

The display device may further include an inorganic insulating layer on the base layer. At least one of the conductive patterns may be on the inorganic insulating layer. The insulating layer may have an opening exposing the inorganic insulating layer. The light emitting elements may be in the opening.

The insulating layer may not be between the base layer and the light emitting elements.

A height of a top surface of the inorganic insulating layer in the first area above the base layer may be less than (e.g., lower than) that of the top surface of the inorganic insulating layer in the second area.

The inorganic insulating layer may include a first inorganic insulating layer, a second inorganic insulating layer, and a third inorganic insulating layer, which are sequentially stacked on the base layer. The conductive patterns may include: a back gate electrode between the base layer and the first inorganic insulating layer, the back gate electrode overlapping a semiconductor pattern; a gate electrode on the first inorganic insulating layer, the gate electrode overlapping the semiconductor pattern; a first capacitor electrode on the first inorganic insulating layer, the first capacitor electrode overlapping the back gate electrode; a second capacitor electrode on the second inorganic insulating layer, the second capacitor electrode being connected to one region of the semiconductor pattern through a contact opening penetrating the second inorganic insulating layer, the second capacitor electrode overlapping the first capacitor electrode; and a bridge pattern on the third inorganic insulating layer, the bridge pattern being connected to the second capacitor electrode through a contact opening penetrating the third inorganic insulating layer, the bridge pattern being connected to the first electrode through a contact opening penetrating the insulating layer.

The back gate electrode and the first capacitor electrode may form a first capacitor by overlapping each other, and the first capacitor electrode and the second capacitor electrode may form a second capacitor by overlapping each other.

The third electrode and the fourth electrode may be formed in the same layer.

The third electrode and the fourth electrode may be spaced apart from each other in different layers with an insulating layer therebetween.

The conductive patterns may include a first power line and a second power line that are spaced apart from each other along a first direction on a plane, the first power line and the second power line extending in a second direction crossing the first direction. One of the first power line and the second power line may be connected to one of the first electrode and the second electrode. At least a portion of the first area may be defined by the first power line and the second power line.

The display device may further include a semiconductor pattern connected to at least some of the conductive patterns. The semiconductor pattern may be in the second area with respect to the first area on a plane. The other portion of the first area may be defined by the semiconductor pattern.

Each of the first electrode and the second electrode may extend in the second direction on a plane, and include a protrusion part protruding to the first area.

Each of the light emitting elements may be a bar type light emitting diode having a size on a nano scale to a micro scale. The light emitting elements may be arranged along the first direction on a plane.

The display device may further include an inorganic insulating layer on the base layer. At least one of the conductive patterns may be on the inorganic insulating layer. The insulating layer may include a first bank pattern and the second bank pattern, which are spaced apart from each other with the first area therebetween. The inorganic insulating layer may be exposed through a space between the first bank pattern and the second bank pattern.

According to another embodiment of the present disclosure, a display device includes: a substrate having a plurality of pixel areas, each of the pixel areas has a first area and a second area extending around a periphery of the first area; conductive patterns including a first line and a second line as lines in the second area, the first line and the second line extending in a first direction and spaced apart from each other in a second direction crossing the first direction; and light emitting elements in the first area, the light emitting elements being connected between the first line and the second line. At least a portion of the first area is defined by the first line and the second line, and the light emitting elements do not overlap the conductive patterns.

The display device may further include an insulating layer covering the conductive patterns. The light emitting elements may not overlap the insulating layer.

The display device may further include a first electrode and a second electrode extending in the first direction, the first electrode and the second electrode being spaced apart from each other in the first area. The light emitting elements may be connected between the first electrode and the second electrode. One of the first line and the second line may be connected to one of the first electrode and the second electrode.

The display device may further include: a third electrode overlapping the first electrode and one end portion of the light emitting elements to contact the first electrode and the one end portion of the light emitting elements; and a fourth electrode overlapping the second electrode and the other end portion of the light emitting elements to contact the second electrode and the other end portion of the light emitting elements.

Each of the light emitting elements may be a bar type light emitting diode which have a size on a nano scale to a micro scale. The light emitting elements may be arranged along the first direction on a plane.

The display device may further include a transistor in the second direction with respect to the first area, the transistor being connected to the other of the first line and the second line. The first area may be further defined by the transistor.

BRIEF DESCRIPTION OF THE DRAWINGS

Example embodiments will now be described more fully hereinafter with reference to the accompanying drawings; however, the present disclosure may be embodied in different forms and should not be construed as limited to the embodiments set forth herein. Rather, these embodiments are provided so that this disclosure will be thorough and complete, and will fully convey the scope of the present disclosure to those skilled in the art.

FIGS. 9A to 9E are plan views illustrating conductive layers and a semiconductor layer included in the first pixel shown in FIG. 8.

FIGS. 11C to 11E are sectional views illustrating another example of the first pixel taken along the lines I-I' and II-II' shown in FIG. 8.

DETAILED DESCRIPTION

Figure 1A:
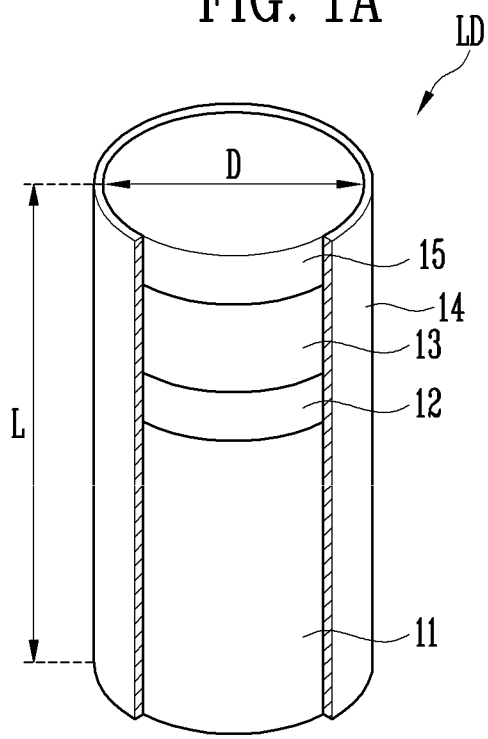
FIG. 1A is a view illustrating a light emitting element according to an embodiment of the present disclosure.

The present disclosure may be embodied in various changes and different shapes; therefore, the present disclosure describes, in detail, example embodiments. However, the described examples do not limit the present disclosure to certain shapes, configurations, etc. but apply to all changes and equivalent material and structures.

In the following embodiments and the attached drawings, elements not directly related to the present disclosure may be omitted from depiction for convenience, and dimensional relationships among individual elements in the attached drawings may be illustrated for ease of understanding but not to limit the actual scale.

It will be understood that when an element or layer is referred to as being "on," "connected to," or "coupled to" another element or layer, it may be directly on, connected, or coupled to the other element or layer or one or more intervening elements or layers may also be present. When an element or layer is referred to as being "directly on," "directly connected to," or "directly coupled to" another element or layer, there are no intervening elements or layers present. For example, when a first element is described as being "coupled" or "connected" to a second element, the first element may be directly coupled or connected to the second element or the first element may be indirectly coupled or connected to the second element via one or more intervening elements.

The same reference numerals designate the same elements. As used herein, the term "and/or" includes any and all combinations of one or more of the associated listed items. Further, the use of "may" when describing embodiments of the present invention relates to "one or more embodiments of the present invention." Expressions, such as "at least one of," when preceding a list of elements, modify the entire list of elements and do not modify the individual elements of the list. Also, the term "exemplary" is intended to refer to an example or illustration. As used herein, the terms "use," "using," and "used" may be considered synonymous with the terms "utilize," "utilizing," and "utilized," respectively. As used herein, the terms "substantially," "about," and similar terms are used as terms of approximation and not as terms of degree, and are intended to account for the inherent variations in measured or calculated values that would be recognized by those of ordinary skill in the art.

It will be understood that, although the terms first, second, third, etc. may be used herein to describe various elements, components, regions, layers, and/or sections, these elements, components, regions, layers, and/or sections should not be limited by these terms. These terms are used to distinguish one element, component, region, layer, or section from another element, component, region, layer, or section. Thus, a first element, component, region, layer, or section discussed below could be termed a second element, component, region, layer, or section without departing from the teachings of example embodiments.

Spatially relative terms, such as "beneath," "below," "lower," "above," "upper," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" or "over" the other elements or features. Thus, the term "below" may encompass both an orientation of above and below. The device may be otherwise oriented (rotated 90 degrees or at other orientations), and the spatially relative descriptors used herein should be interpreted accordingly.

The terminology used herein is for the purpose of describing particular example embodiments of the present invention and is not intended to be limiting of the described example embodiments of the present invention. As used herein, the singular forms "a" and "an" are intended to include the plural forms as well, unless the context clearly indicates otherwise. It will be further understood that the terms "includes," "including," "comprises," and/or "comprising," when used in this specification, specify the presence of stated features, integers, steps, operations, elements, and/or components but do not preclude the presence or addition of one or more other features, integers, steps, operations, elements, components, and/or groups thereof.

Figure 1B:
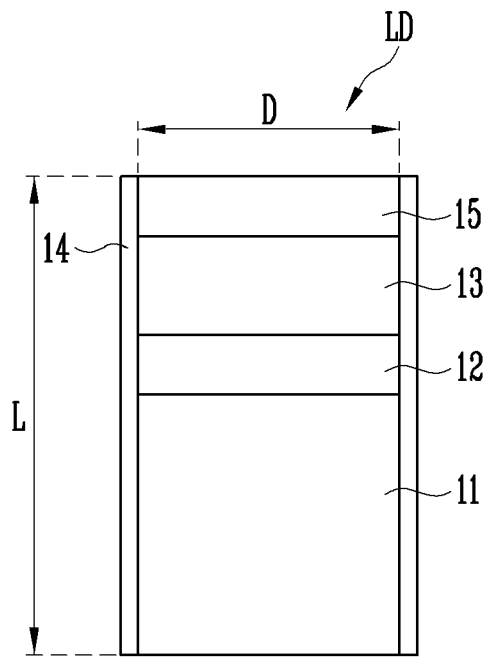
FIG. 1B is a sectional view of the light emitting element shown in FIG. 1A.
Figure 2A:
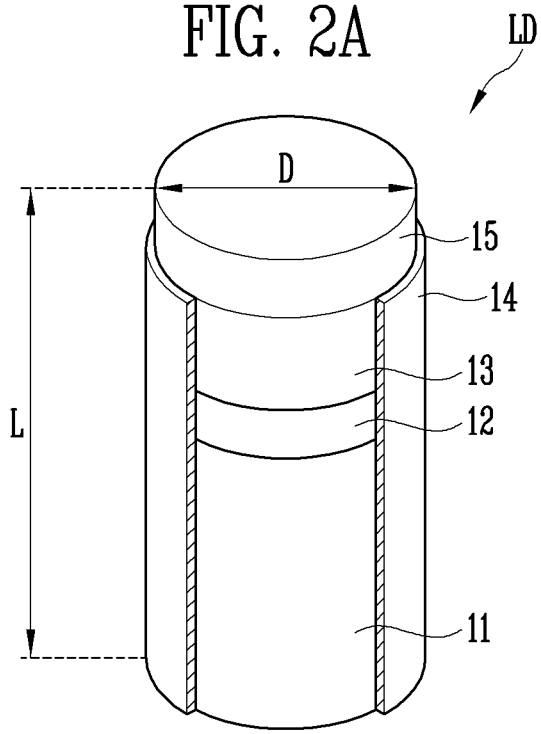
FIG. 2A is a view illustrating a light emitting element according to another embodiment of the present disclosure.
Figure 2B:
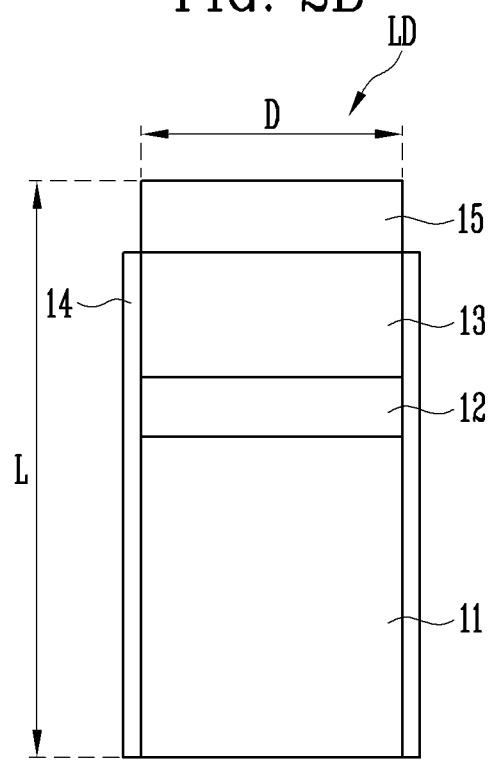
FIG. 2B is a sectional view of the light emitting element shown in FIG. 2A.
Figure 3A:
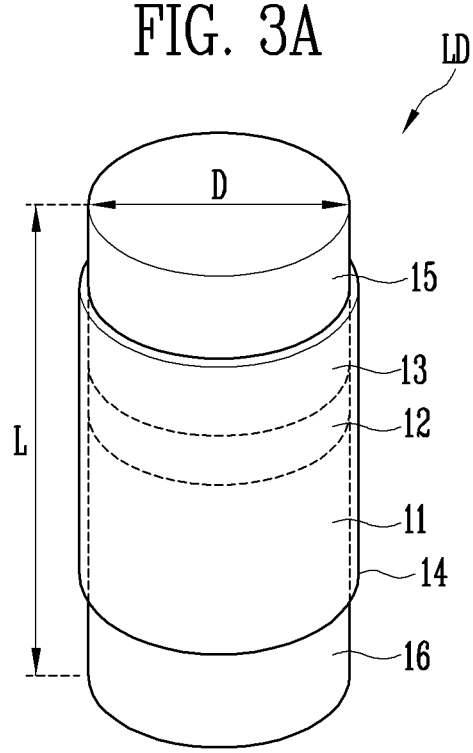
FIG. 3A is a view illustrating a light emitting element according to another embodiment of the present disclosure.
Figure 3B:
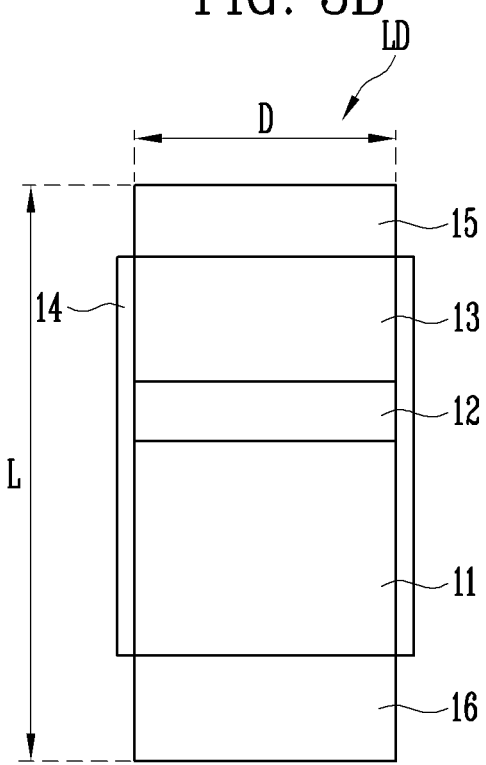
FIG. 3B is a sectional view of the light emitting element shown in FIG. 3A.
Figure 4A:
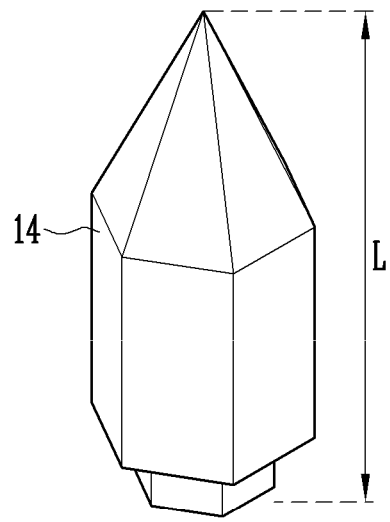
FIG. 4A is a view illustrating a light emitting element according to another embodiment of the present disclosure.
Figure 4B:
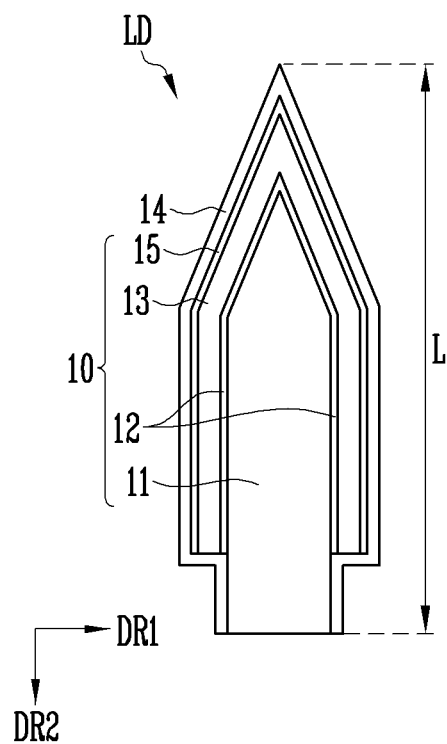
FIG. 4B is a sectional view of the light emitting element shown in FIG. 4A.

FIG. 1A is a view illustrating a light emitting element according to an embodiment of the present disclosure, and FIG. 1B is a sectional view of the light emitting element shown in FIG. 1A. FIG. 2A is a view illustrating a light emitting element according to another embodiment of the present disclosure, and FIG. 2B is a sectional view of the light emitting element shown in FIG. 2A. FIG. 3A is a view illustrating a light emitting element according to another embodiment of the present disclosure, and FIG. 3B is a sectional view of the light emitting element shown in FIG. 3A. FIG. 4A is a view illustrating a light emitting element according to another embodiment of the present disclosure, and FIG. 4B is a sectional view of the light emitting element shown in FIG. 4A.

FIGS. 1A, 1B, 2A, 2B, 3A, and 3B, each of which illustrate light emitting elements fabricated through an etching process, will be described below, and FIGS. 4A and 4B, which illustrate a light emitting element fabricated through a growth process, will be described further below. Embodiments of the present disclosure are not limited to kinds and/or shapes of the light emitting elements shown in FIGS. 1A, 1B, 2A, 2B, 3A, 3B, 4A, and 4B.

First, referring to FIGS. 1A, 1B, 2A, 2B, 3A, and 3B, each light emitting element LD may include a first semiconductor layer 11, a second semiconductor layer 13, and an active layer 12 interposed between the first and second semiconductor layers 11 and 13. In an example, the light emitting element LD may be implemented as a light emitting stack structure in which the first semiconductor layer 11, the active layer 12, and the second semiconductor layer 13 are sequentially stacked.

In an embodiment, the light emitting element LD may have a shape extending in one direction. When the extending direction of the light emitting element LD is a length direction, the light emitting element LD may have one end portion and the other end portion along the extending direction. Any one of the first and second semiconductor layers 11 and 13 may be disposed at the one end portion of the light emitting element LD, and the other of the first and second semiconductor layers 11 and 13 may be disposed at the other end portion of the light emitting element LD.

The light emitting element LD may have various suitable shapes. For example, the light emitting element LD may have a rod-like shape or bar-like shape, which is long (e.g., elongated or extended) in its length direction (i.e., has an aspect ratio that is greater than 1). For example, a length L of the light emitting element LD in the length direction may be larger than a diameter D (or a width of a cross-section) of the light emitting element LD. The light emitting element LD may include a light emitting diode fabricated small enough to have a diameter D and/or a length L on a micro scale or nano scale. Throughout the present disclosure, however, the size of the light emitting element LD may be modified to be suitable for requirements (or design conditions) of a lighting device or a self-luminescent display device to which the light emitting element LD is to be applied.

The first semiconductor layer 11 may include at least one n-type semiconductor layer. For example, the first semiconductor layer 11 may include any one semiconductor material from among InAlGaN, GaN, AlGaN, InGaN, AlN, and InN may and include an n-type semiconductor layer doped with a first conductive dopant such as Si, Ge, or Sn. However, the first semiconductor layer 11 is not limited to the above materials. The first semiconductor layer 11 may be configured with (e.g., may include or may be formed of) various suitable materials.

The active layer 12 is formed on the first semiconductor layer 11 and may be formed in a single or multiple quantum well structure. The position of the active layer 12 may be variously, suitably changed depending on a kind of the light emitting element LD. The active layer 12 may emit light having a wavelength in a range of 400 nm to 900 nm and may use a double heterostructure. A clad layer doped with a conductive dopant may be formed on the top and/or the bottom of the active layer 12. In an example, the clad layer may be formed as an AlGaN layer or InAlGaN layer. In some embodiments, a material, such as AlGaN or AlInGaN, may be used to form the active layer 12. In addition, the active layer 12 may be configured with various suitable materials.

When an electric field having a reference voltage or more (e.g., a predetermined voltage or more) is applied to both (or between both) end portions of the light emitting element LD, the light emitting element LD emits light as electron-hole pairs are combined in the active layer 12. The light emission of the light emitting element LD is controlled by using such a principle, so that the light emitting element LD can be used as a light source for various light emitting apparatuses, including in a pixel of a display device.

The second semiconductor layer 13 is formed on the active layer 12, and may include a semiconductor layer having a type different from that of the first semiconductor layer 11. The second semiconductor layer 13 may include at least one p-type semiconductor material. For example, the second semiconductor layer 13 may include at least one semiconductor material from among InAlGaN, GaN, AlGaN, InGaN, AlN, and InN and may include a p-type semiconductor layer doped with a second conductive dopant, such as Mg. However, the second semiconductor layer 13 is not limited to the materials described above. The second semiconductor layer 13 may be configured with various suitable materials.

In an embodiment of the present disclosure, the first semiconductor layer 11 and the second semiconductor layer 13 may have different lengths (or thicknesses) in the length L direction of the light emitting element LD. In an example, the first semiconductor layer 11 may have a length (or thickness) that is relatively longer (or thicker) than that of the second semiconductor layer 13 along the length L direction of the light emitting element LD. Accordingly, the active layer 12 of the light emitting element LD may be located more adjacent to an upper surface of the second semiconductor layer 13 than to a lower surface of the first semiconductor layer 11 as shown in FIGS. 1A to 3B.

In an embodiment, the light emitting element LD may further include an additional electrode 15 disposed on the top of the second semiconductor layer 13, in addition to the first semiconductor layer 11, the active layer 12, and the second semiconductor layer 13, which are described above. In some embodiments, the light emitting element LD may further include another additional electrode 16 disposed at one end of the first semiconductor layer 11 as shown in FIGS. 3A and 3B.

The additional electrodes 15 and 16 may be ohmic contact electrodes, but the present disclosure is not limited thereto. In some embodiments, the additional electrodes 15 and 16 may be Schottky contact electrodes. The additional electrodes 15 and 16 may include a metal or metal oxide. For example, the additional electrodes 15 and 16 may include one or a mixture of chromium (Cr), titanium (Ti), aluminum (Al), gold (Au), nickel (Ni), ITO, and any oxide or alloy thereof, but the present disclosure is not limited thereto.

Materials respectively included in the additional electrodes 15 and 16 may be identical to or different from each other (e.g., the additional electrodes 15 and 16 may include the same materials as each other or different materials from each other). The additional electrodes 15 and 16 may be substantially transparent or translucent. Accordingly, light generated in the light emitting element LD can be emitted to the outside of the light emitting element LD by passing through the additional electrodes 15 and 16. In some embodiments, the additional electrodes 15 and 16 may include an opaque metal such that light generated in the light emitting element LD does not pass through the additional electrodes 15 and 16 and is emitted to the outside of the light emitting element LD through an area other than both the end portions of the light emitting element LD.

In an embodiment, the light emitting element LD may further include an insulative film 14. However, in some embodiments, the insulative film 14 may be omitted or may be provided to cover only portions of the first semiconductor layer 11, the active layer 12, and the second semiconductor layer 13.

The insulative film 14 can prevent or substantially prevent an electrical short circuit that may occur when the active layer 12 of one light emitting element LD contacts a conductive material except the first semiconductor layer 11 and the second semiconductor layer 13. Also, the insulative film 14 is formed so that a surface defect on (or in) the light emitting element LD is reduced or minimized, thereby improving the lifespan and efficiency of the light emitting element LD. Also, when a plurality of light emitting elements LD are densely disposed, the insulative film 14 can prevent or substantially prevent an unwanted short circuit that may occur between the light emitting elements LD. Whether the insulative film 14 is provided is not limited (e.g., the insulative film 14 may be omitted) as long as the active layer 12 is prevented or substantially prevented from short circuiting with external conductive material.

As shown in FIGS. 1A and 1B, the insulative film 14 may be provided to entirely surround the outer circumference of the light emitting stack structure including the first semiconductor layer 11, the active layer 12, the second semiconductor layer 13, and the additional electrode 15. For convenience of description, the insulative film 14 illustrated in FIG. 1A has a cut-away portion showing the underlying layers, and the first semiconductor layer 11, the active layer 12, the second semiconductor layer 13, and the additional electrode 15, which are included in the actual light emitting element LD, may be surrounded (e.g., entirely surrounded along their peripheries) by the insulative film 14.

Although an embodiment in which the insulative film 14 is provided in a shape entirely surrounding the outer circumference of each of the first semiconductor layer 11, the active layer 12, the second semiconductor layer 13, and the additional electrode 15 is described in the above-described embodiment, the present disclosure is not limited thereto.

In some embodiments, as shown in FIGS. 2A and 2B, the insulative film 14 may surround the outer circumference of each of the first semiconductor layer 11, the active layer 12, and the second semiconductor layer 13 but may not surround (or may not entirely surround) the outer circumference of the additional electrode 15 disposed on the second semiconductor layer 13. In other embodiments, the insulative film 14 may surround only a portion of the outer circumference of the additional electrode 15 and may not surround (e.g., may expose) the other portion of the outer circumference of the additional electrode 15. However, the insulative film 14 may expose at least both the end portions of the light emitting element LD. In an example, the insulative film 14 may expose one end portion of the first semiconductor layer 11 and the additional electrode 15 disposed at one end of the second semiconductor layer 13. In some embodiments, as shown in FIGS. 3A and 3B, when the additional electrodes 15 and 16 are disposed at opposite end portions of the light emitting element LD, the insulative film 14 may expose at least one area of each of the additional electrodes 15 and 16. In another embodiment, the insulative film 14 may be omitted.

According to an embodiment of the present disclosure, the insulative film 14 may include a transparent insulating material. For example, the insulative film 14 may include at least one insulating material selected from a group consisting of $SiO_2$, $Si_3N_4$, $Al_2O_3$, and $TiO_2$. However, the present disclosure is not limited thereto, and the insulative film 14 may include various suitable materials having insulating properties.

When the insulative film 14 is provided in the light emitting element LD, the active layer 12 can be prevented (or substantially prevented) from being short-circuited with a first electrode and/or a second electrode. In addition, the insulative film 14 is formed so that a surface defect of the light emitting element LD is reduced or minimized, thereby improving the lifespan and efficiency of the light emitting element LD. In addition, when a plurality of light emitting elements LD are densely disposed, the insulative film 14 can prevent (or substantially prevent) an unwanted short circuit that may occur between the light emitting elements LD.

The light emitting element LD may be used as a light emitting source for various display devices. The light emitting element LD may be fabricated through a surface treatment process. For example, when a plurality of light emitting elements LD are mixed in a liquid solution (or solvent) to be supplied to each light emitting area (e.g., a light emitting area of each pixel or a light emitting area of each sub-pixel), each light emitting element LD may be surface-treated such that the light emitting elements LD are not unequally condensed in the solution but are equally (or substantially equally) dispersed in the solution.

A light emitting apparatus including the light emitting element LD may be used in various types of devices that require a light source, including a display device. When a plurality of light emitting elements LD are disposed in a light emitting area of each pixel of a display panel, the light emitting elements LD may be used as a light source of the pixel. However, the application field of the light emitting element LD is not limited to the above-described example. For example, the light emitting element LD may be used in other types of devices that require a light source, such as a lighting device.

Next, a light emitting element LD fabricated through a growth process will be described with reference to FIGS. 4A and 4B.

In the following description of the light emitting element LD fabricated through the growth process, aspects and features of the light emitting element LD different from those of the above-described embodiments will be primarily described to avoid redundancy. Aspects and features of the light emitting element LD fabricated through the growth process that are not particularly described are the same or substantially similar to the above-described embodiments. In addition, components similar and/or identical to those of the above-described embodiment are designated by like reference numerals.

Referring to FIGS. 4A and 4B, the light emitting element LD according to an embodiment of the present disclosure includes a first semiconductor layer 11, a second semiconductor layer 13, and an active layer 12 interposed between the first and second semiconductor layers 11 and 13. In some embodiments, the light emitting element LD may include a light emitting pattern 10 having a core-shell structure including a first semiconductor layer 11 located at the center thereof, an active layer 12 surrounding at least one side of the first semiconductor layer 11, a second semiconductor layer 13 surrounding at least one side of the active layer 12, and an additional electrode 15 surrounding at least one side of the second semiconductor layer 13.

In an embodiment, the first semiconductor layer 11 may be located at a core (e.g., the center (or middle)) of the light emitting element LD. The light emitting element LD may have a shape corresponding to that of the first semiconductor layer 11. In an example, when the first semiconductor layer 11 has a hexagonal pyramid shape, the light emitting element LD and the light emitting pattern 10 may also have a hexagonal pyramid shape.

The active layer 12 may be provided and/or formed in a shape surrounding the outer circumference of the first semiconductor layer 11 in the length L direction of the light emitting element LD. For example, the active layer 12 may be provided and/or formed in a shape surrounding the other area except the other end portion disposed at a lower side between both end portions of the first semiconductor layer 11 in the length L direction of the light emitting element LD.

The second semiconductor layer 13 may be provided and/or formed in a shape surrounding the active layer 12 in the length L direction of the light emitting element LD and may include a semiconductor layer having a type different from that of the first semiconductor layer 11. In an example, the second semiconductor layer 13 may include at least one p-type semiconductor layer.

In an embodiment, the light emitting element LD may include an additional electrode 15 surrounding at least one side of the second semiconductor layer 13. The additional electrode 15 may be an ohmic contact electrode or a Schottky contact electrode, which is electrically connected to the second semiconductor layer 13, but the present disclosure is not limited thereto.

As described above, the light emitting element LD may have a hexagonal pyramid shape having both protruding end portions and may include a light emitting pattern 10 having a core-shell structure including a first semiconductor layer 11 located at the center thereof, an active layer 12 surrounding at least one side of the first semiconductor layer 11, a second semiconductor layer 13 surrounding at least one side of the active layer 12, and an additional electrode 15 surrounding at least one side of the second semiconductor layer 13. The first semiconductor layer 11 may be disposed at one end portion (or lower end portion) of the light emitting element LD having the hexagonal pyramid shape, and the additional electrode 15 may be disposed at the other end portion (or upper end portion) of the light emitting element LD.

In some embodiments, the light emitting element LD may further include an insulative film 14 provided on the outer circumference of the light emitting pattern 10 having the core-sell structure. The insulative film 14 may include a transparent insulating material.

Figure 5:
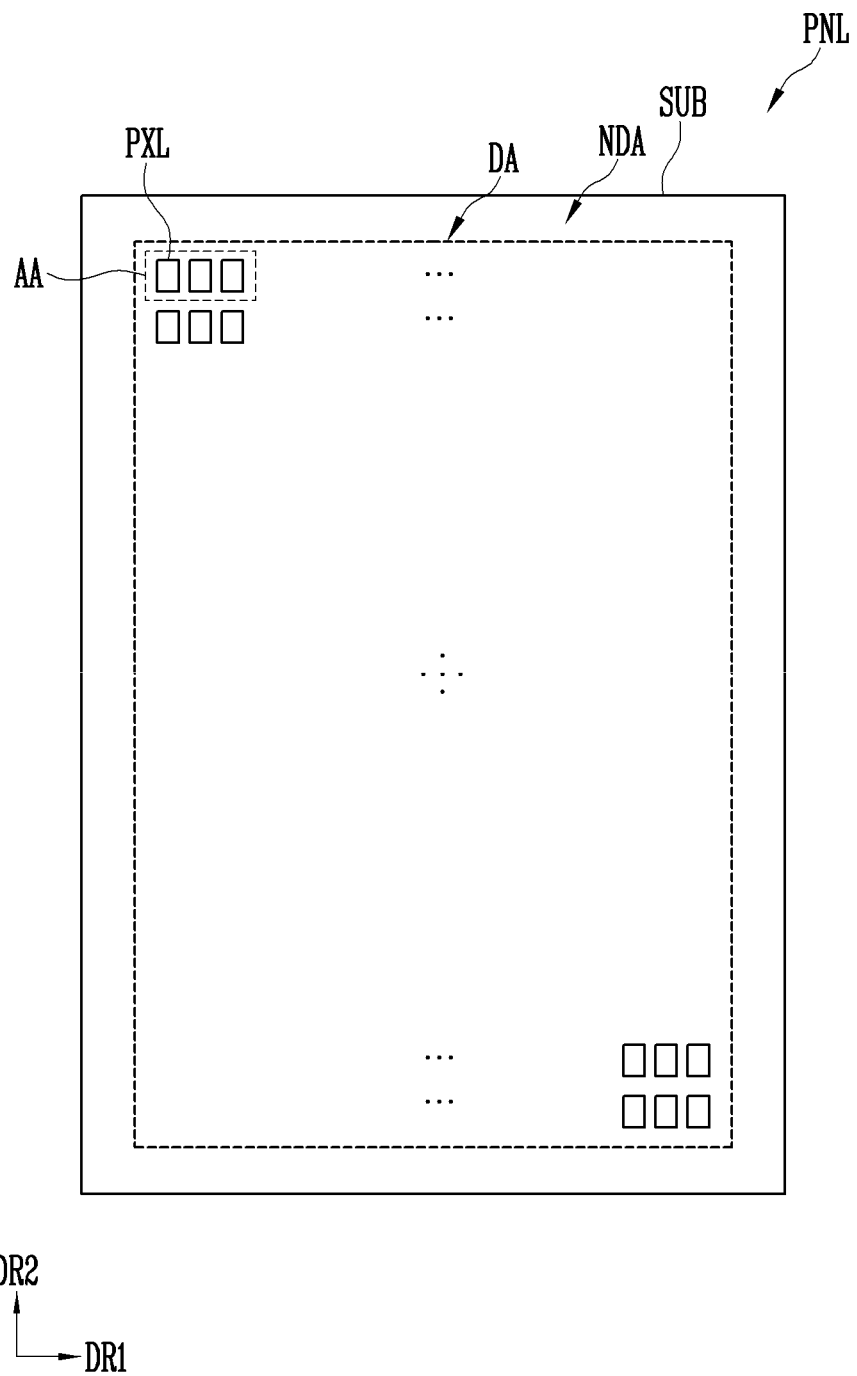
FIG. 5 is a plan view illustrating a display device according to an embodiment of the present disclosure.

FIG. 5 is a plan view illustrating a display device according to an embodiment of the present disclosure. In some embodiments, a display device, for example, a display panel PNL provided in the display device is illustrated as an example of a device which can use the light emitting element LD described in FIGS. 1A to 4B as a light source. In some embodiments, a structure of the display panel PNL is briefly illustrated based on a display area DA. In some embodiments, at least one driving circuit (e.g., a scan driver and a data driver) and/or a plurality of lines may be further disposed in the display panel PNL.

Referring to FIG. 5, the display panel PNL may include a base layer SUB (or substrate) and pixels PXL (or sub-pixels) arranged on the base layer SUB. The display panel PNL and the base layer SUB may have the display area DA in which an image is displayed and a non-display area NDA other than the display area DA.

In some embodiments, the display area DA is disposed in a central area of the display panel PNL and the non-display area NDA may be disposed along an edge of the display panel PNL to surround (e.g., to surround a periphery of) the display area DA. However, the positions of the display area DA and the non-display area NDA are not limited thereto and may be suitably changed.

The base layer SUB may be a base member of the display panel PNL. For example, the base layer SUB may be a base member of a lower panel (e.g., a lower plate of the display panel PNL).

In some embodiments, the base layer SUB may be a rigid substrate or a flexible substrate such that the material and/or physical property of the base layer SUB is not particularly limited. In an embodiment, the base layer SUB may be a rigid substrate including (or made of) glass or tempered glass and, in other embodiments, may be a flexible substrate including a thin film including (or made of) plastic or metal. Also, the base layer SUB may be a transparent substrate, but the present disclosure is not limited thereto. In an example, the base layer SUB may be a translucent substrate, an opaque substrate, or a reflective substrate.

One area on the base layer SUB is defined as the display area DA and the pixels PXL are arranged therein, and the other area is defined as the non-display area NDA. In an example, the base layer SUB may have the display area DA including a plurality of pixel areas in which the pixels PXL are formed and the non-display area NDA disposed at the periphery of the display area DA. Various lines and/or one or more built-in circuits, which are connected to the pixels PXL of the display area DA, may be disposed in the non-display area NDA.

The pixels PXL may each include at least one light emitting element LD (e.g., at least one bar type light emitting diode according to any one of the embodiments shown in FIGS. 1A to 4B), which is driven by a corresponding scan signal and a corresponding data signal. For example, the pixel PXL may include a plurality of bar type light emitting diodes which have a size on a nano scale to a micro scale and are connected in parallel to each other. The plurality of bar type light emitting diodes may form a light source of the pixel PXL.

Although an embodiment in which the pixels PXL are arranged in a stripe shape is illustrated in FIG. 5, the present disclosure is not limited thereto. For example, the pixels PXL may be arranged in various suitable pixel arrangement forms.

Figure 6:
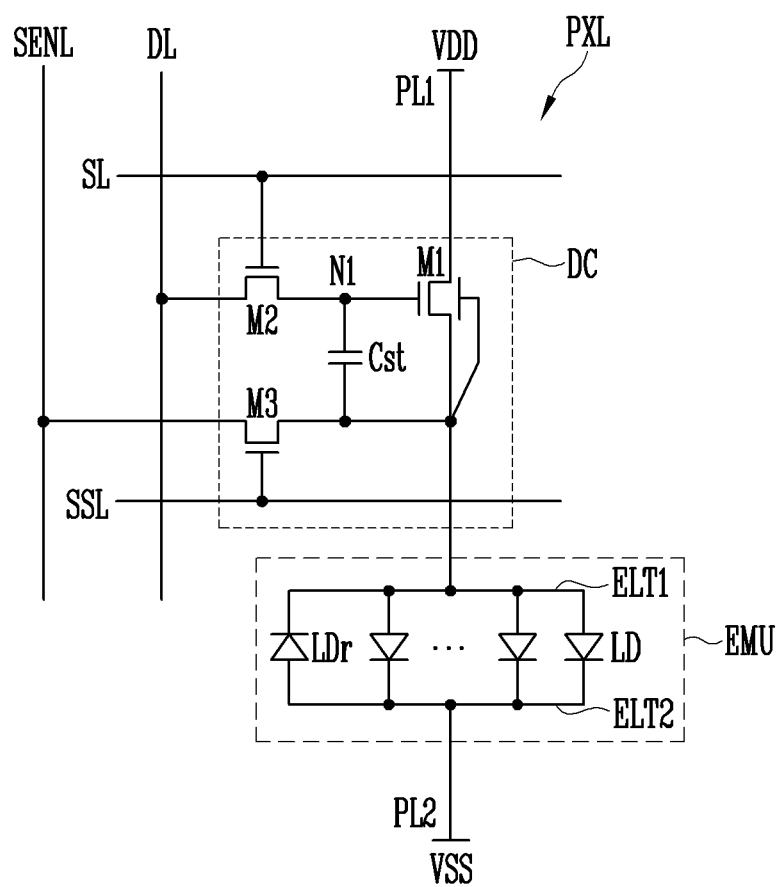
FIG. 6 is a circuit diagram illustrating an example of a pixel included in the display device shown in FIG. 5.

FIG. 6 is a circuit diagram illustrating an example of the pixel included in the display device shown in FIG. 5.

Referring to FIG. 6, the pixel PXL may include a light emitting unit EMU and a pixel driving circuit DC for driving the light emitting unit EMU.

The light emitting unit EMU may be connected between a first power source VDD (or first driving power source) and a second power source VSS (or second driving power source). The light emitting unit EMU may include a plurality of light emitting elements LD connected in parallel between the first power source VDD (or a first power line PL1 to which the first power source VDD is applied) and the second power source VSS (or a second power line PL2 to which the second power source VSS is applied).

The light emitting unit EMU may include a first electrode ELT1 (or first alignment electrode) connected to the first power source VDD via the pixel driving circuit DC, a second electrode ELT2 (or second alignment electrode) connected to the second power source VSS, and a plurality of light emitting elements LD connected in parallel in the same direction between the first and second electrodes ELT1 and ELT2. For example, the first electrode ELT1 may be an anode electrode, and the second electrode EL2 may be a cathode electrode.

Each of the light emitting elements LD included in the light emitting unit EMU may include a first end portion connected to the first power source VDD through the first electrode ELT1 and a second end portion connected to the second power source VSS through the second electrode ELT2. The first power source VDD may be a high-potential power source, and the second power source VSS may be a low-potential power source. A potential difference between the first and second power sources VDD and VSS may be set to a threshold voltage or more of the light emitting elements LD during an emission period of the pixel PXL.

As described above, the light emitting elements LD, which are connected in parallel in the same direction (e.g., a forward direction) between the first electrode ELT1 and the second electrode ELT2 and to which voltages having different potentials are respectively supplied, may form an effective light source.

The light emitting elements LD of the light emitting unit EMU may emit light with a luminance corresponding to a driving current supplied through the corresponding pixel driving circuit DC. For example, the pixel driving circuit DC may supply, to the light emitting unit EMU, a driving current corresponding to a grayscale value of corresponding frame data during each frame period. The driving current supplied to the light emitting unit EMU may be divided to flow through the light emitting elements LD connected in the same direction. Accordingly, the light emitting unit EMU emits light with a luminance corresponding to the driving current while each light emitting element LD emits light with a luminance corresponding to a current flowing therethrough.

In some embodiments, the light emitting unit EMU may further include at least one ineffective light source in addition to the light emitting elements LD forming the respective effective light sources. For example, at least one light emitting element LDr (hereinafter the "reverse light emitting element LDr") may be connected in reverse between the first and second electrodes ELT1 and ELT2 of the light emitting unit EMU. The reverse light emitting element LDr along with the light emitting elements LD forming the effective light sources are connected in parallel between the first and second electrodes ELT1 and ELT2, but the reverse light emitting element LDr may be connected between the first and second electrodes ELT1 and ELT2 in a direction opposite to that in which the light emitting elements LD are connected. Although a reference driving voltage (e.g., a forward driving voltage) is applied between the first and second electrodes ELT1 and ELT2, the reverse light emitting element LDr may maintain an inactive state (e.g., may not emit light), and accordingly, no current may flow through (or no substantial current may flow through) the reverse light emitting element LDr.

In an embodiment of the present disclosure, the pixel driving circuit DC may include a first transistor M1, a second transistor M2, a third transistor M3, and a storage capacitor Cst.

A first electrode of the first transistor (e.g., the driving transistor) M1 may be connected to the first power source VDD, and a second electrode of the first transistor M1 may be electrically connected to the first electrode ELT1 of the light emitting unit EMU. A gate electrode of the first transistor M1 may be connected to a first node N1. The first transistor M1 may control an amount of driving current supplied to the light emitting elements LD, corresponding to a voltage at the first node N1.

Also, the first transistor M1 may further include a back gate electrode connected to the first electrode ELT1. The back gate electrode may be disposed to overlap the gate electrode with an insulating layer interposed therebetween, form (or constitute) a body of the first transistor M1, and serve as the gate electrode.

A first electrode of the second transistor (e.g., the switching transistor) M2 may be connected to a data line DL, and a second electrode of the second transistor M2 may be connected to the first node N1. The first electrode and the second electrode of the second transistor M2 are electrodes that are different from each other. For example, when the first electrode is a source electrode, the second electrode may be a drain electrode. A gate electrode of the second transistor M2 may be connected to a scan line SL.

The second transistor M2 may be turned on when a scan signal having a voltage (e.g., a gate-on voltage) at which the second transistor M2 can be turned on is supplied from the scan line SL, to electrically connect the data line DL and the first node N1. A data signal of a corresponding frame may be supplied to the data line DL. Accordingly, the data signal may be transferred to the first node N1. The data signal transferred to the first node N1 may be stored in the storage capacitor Cst.

One electrode of the storage capacitor Cst may be connected to the first node N1, and the other electrode of the storage capacitor Cst may be connected to the first electrode ELT1 of the light emitting unit EMU (or the second electrode of the first transistor M1). The storage capacitor Cst may be charged with a voltage corresponding to the data signal supplied to the first node N1 and may maintain the charged voltage until a data signal of a next frame is supplied.

A gate electrode of the third transistor M3 may be connected to a sensing signal line SSL. One electrode of the third transistor M3 may be connected to a sensing line SENL, and the other electrode of the third transistor M3 may be connected to the first electrode ELT1 of the light emitting unit EMU. The third transistor M3 may transfer a voltage (e.g., a voltage value) at the first electrode ELT1 of the light emitting unit EMU (or a voltage at the anode electrode of the light emitting element LD) to the sensing line SENL according to a sensing signal supplied to the sensing signal line SSL in a sensing period. The voltage transferred through the sensing line SENL may be provided to an external circuit (e.g., a timing controller), and the external circuit may extract characteristic information of the pixel PXL (e.g., a threshold voltage, etc. of the first transistor M1), based on the provided voltage value. The extracted characteristic information may be used to convert image data such that a characteristic variation of the pixel PXL is compensated.

For convenience of description, although an embodiment in which the pixel PXL includes three transistors and one capacitor is illustrated in FIG. 6, the present disclosure is not limited thereto. In other embodiments, the structure of the pixel driving circuit DC may be variously, suitably modified. In an example, the pixel driving circuit DC may further additionally include various suitable transistors, such as an initialization transistor for initializing the first node N1 and/or an emission control transistor for controlling the emission time of the light emitting element LD, or other circuit elements, such as a boosting capacitor for boosting the voltage at the first node N1.

Although an embodiment in which all of the transistors (e.g., the first to third transistors M1, M2, and M3) included in the pixel driving circuit DC are N-type transistors is illustrated in FIG. 6, the present disclosure is not limited thereto. For example, at least one of the first to third transistors M1, M2, and M3 included in the pixel driving circuit DC may be changed to a P-type transistor.

Figure 7:
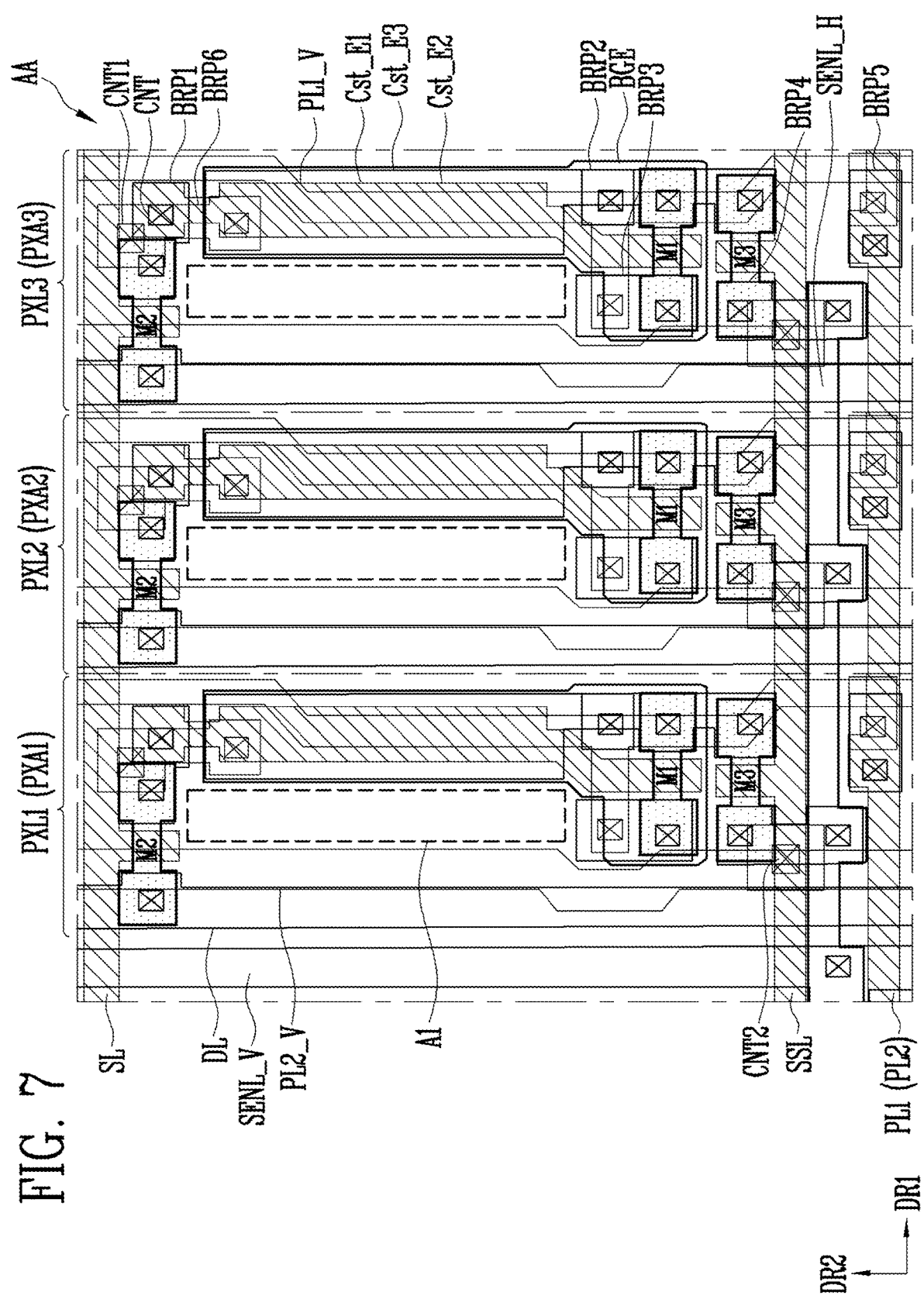
FIG. 7 is a plan view illustrating an example of pixels included in the display device shown in FIG. 5.
Figure 8:
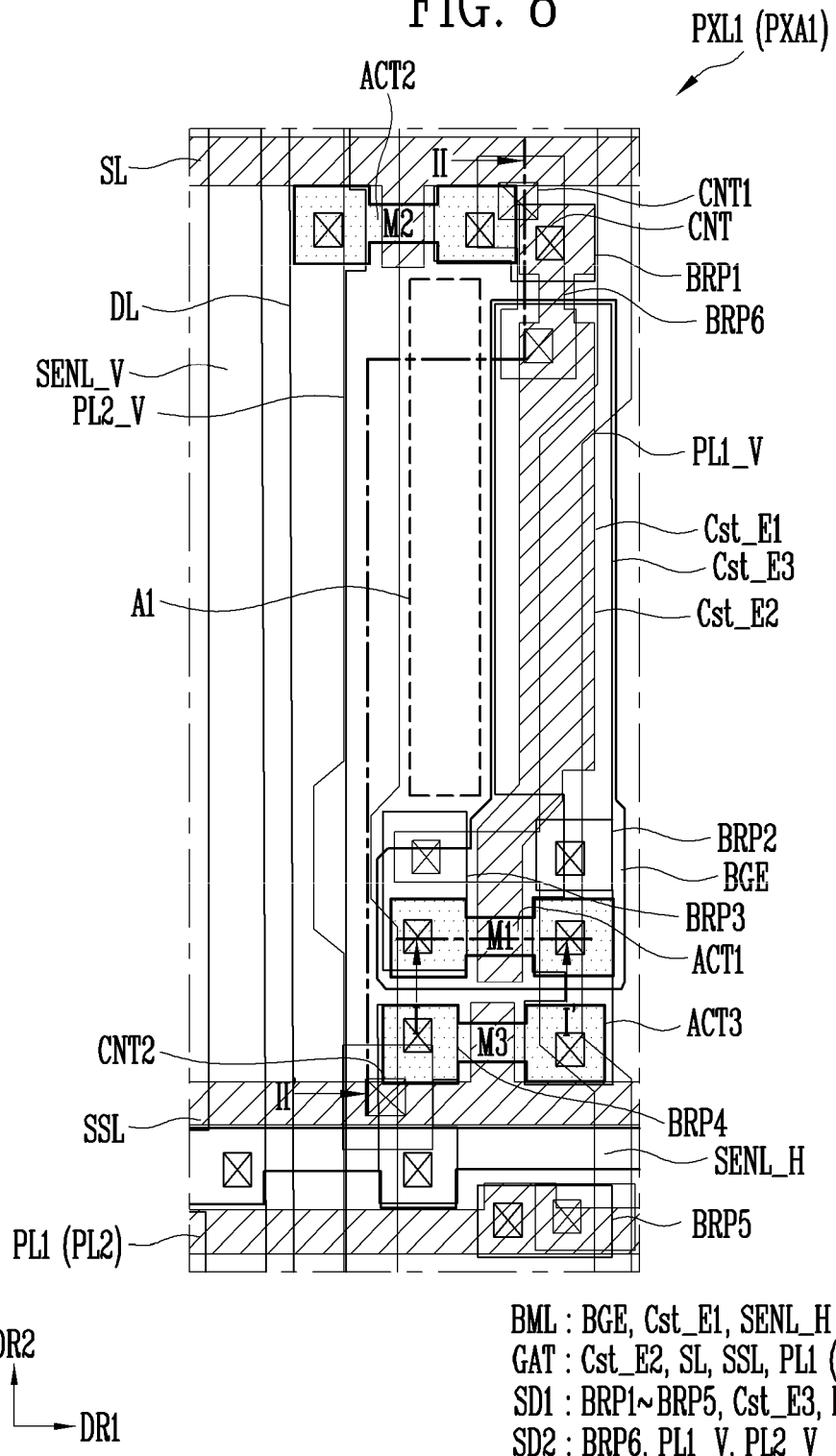
FIG. 8 is a plan view illustrating an example of a first pixel from among the pixels shown in FIG. 7.
Figure 10:
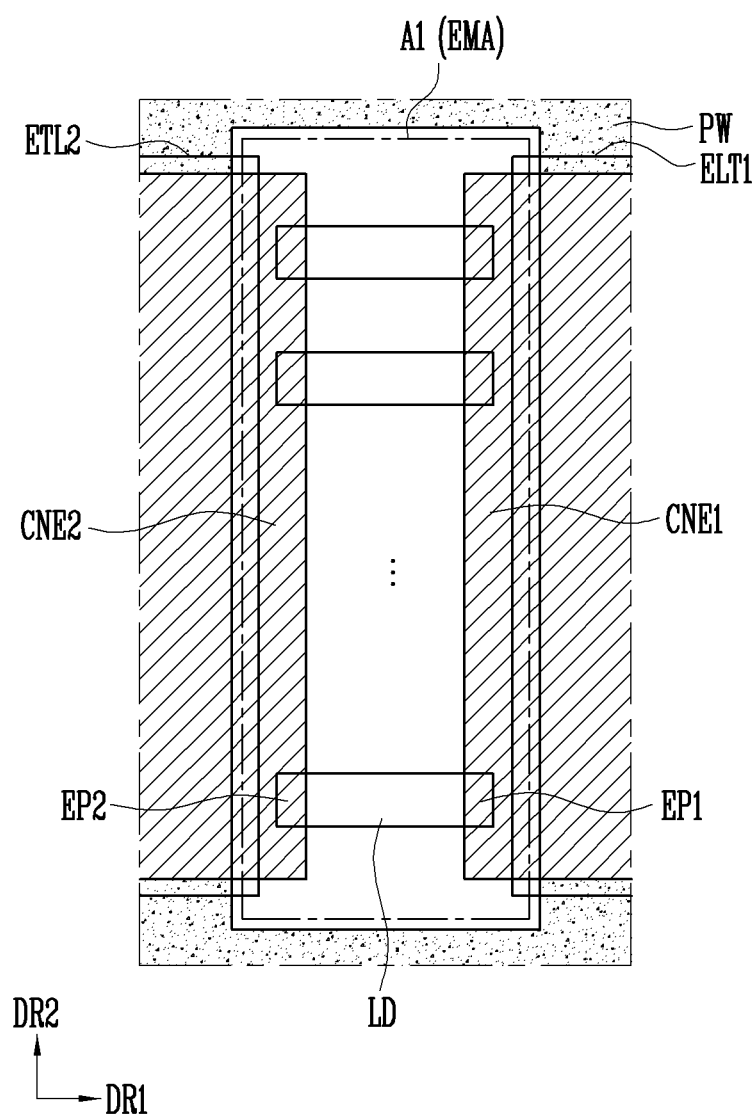
FIG. 10 is an enlarged plan view of a first region shown in FIG. 9F.
Figure 11A:
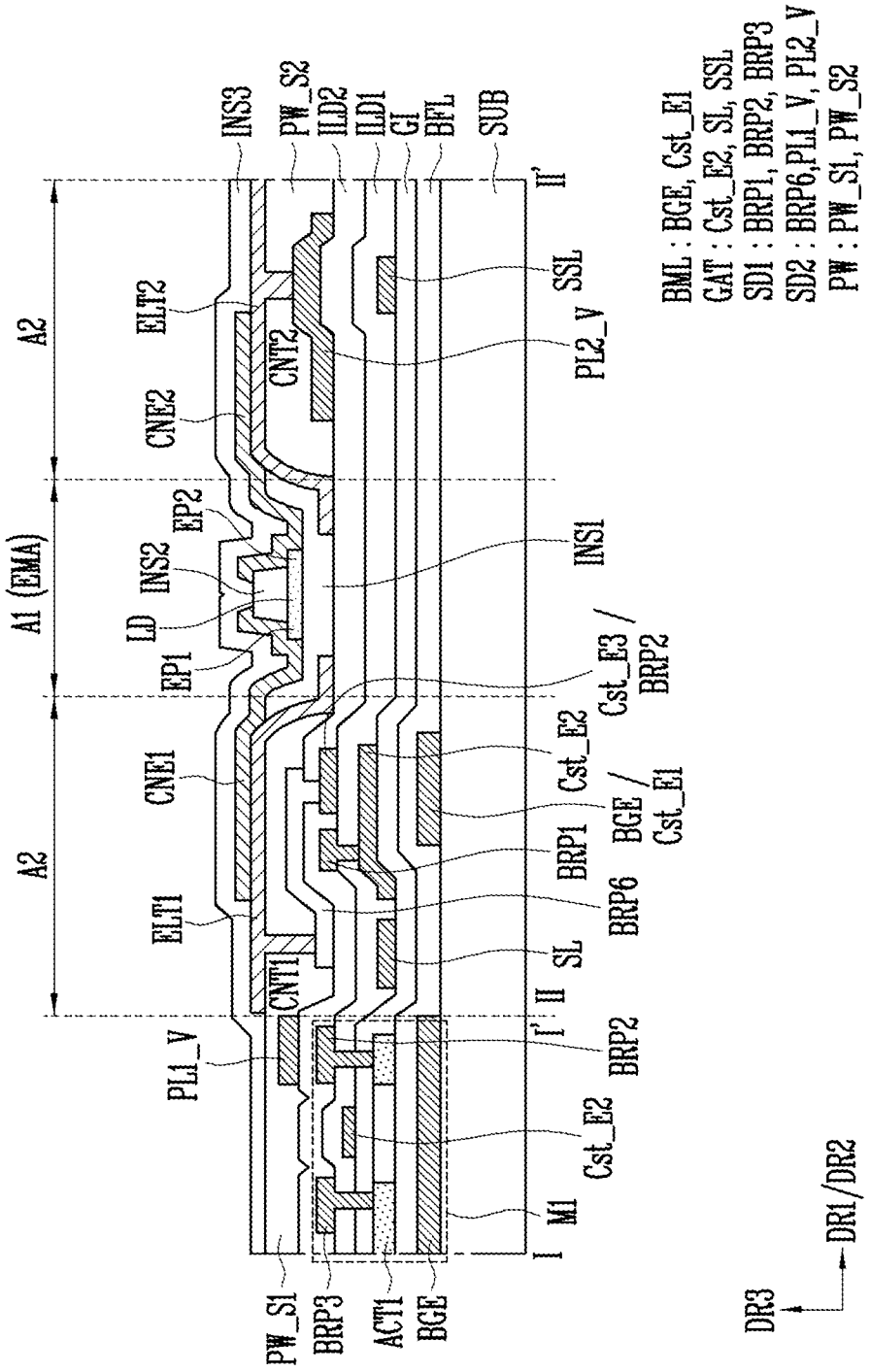
FIGS. 11A and 11B are sectional views illustrating an example of the first pixel taken along the lines I-I' and II-II' shown in FIG. 8.
Figure 11B:
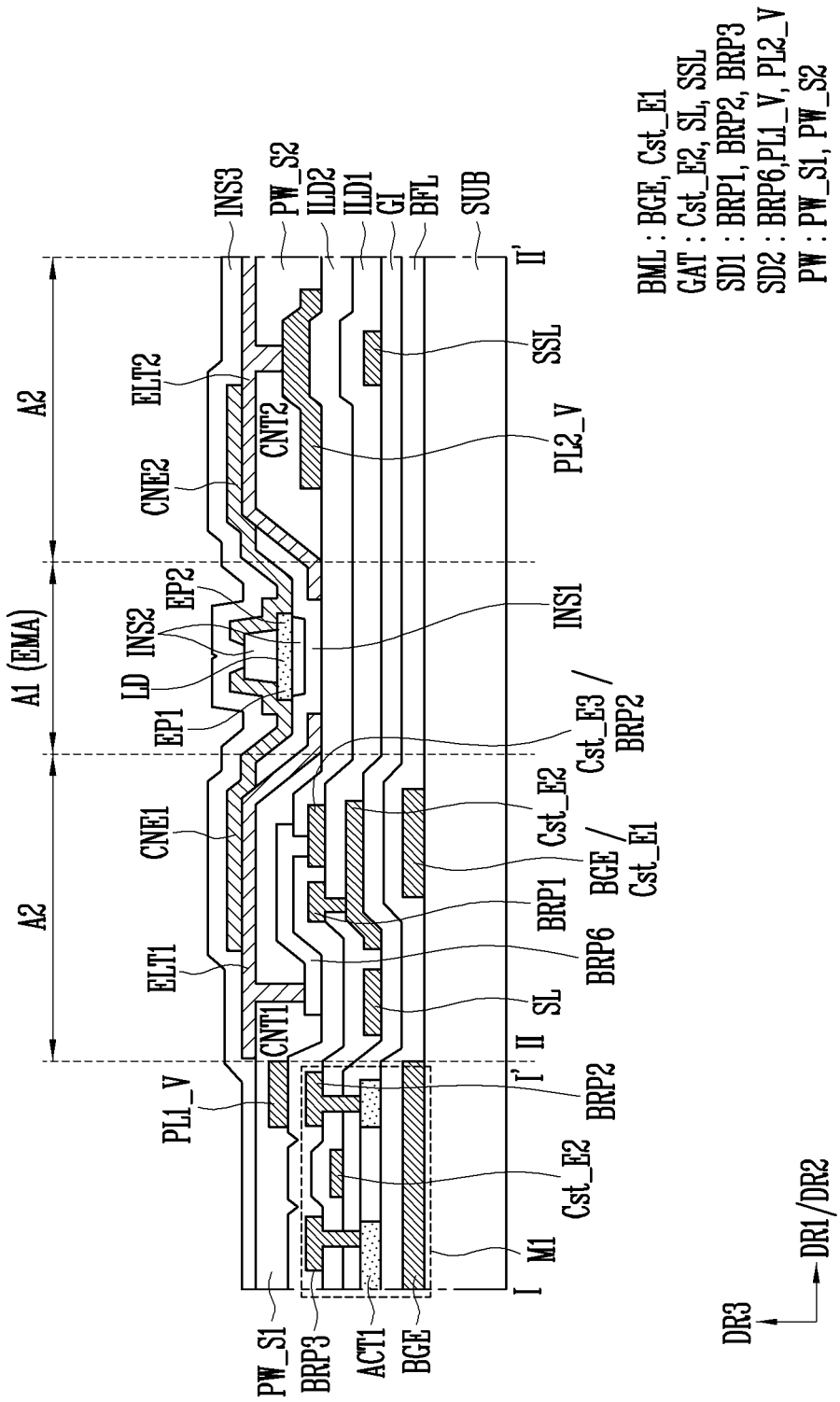

FIG. 7 is a plan view illustrating an example of the pixels included in the display device shown in FIG. 5. Structures of pixels PXL in the region AA shown in FIG. 5 are illustrated in FIG. 7, based on the pixel driving circuit DC (see, e.g., FIG. 6) which drives the light emitting element LD. FIG. 8 is a plan view illustrating an example of a first pixel from among the pixels shown in FIG. 7. FIGS. 9A to 9E are plan views illustrating conductive layers and a semiconductor layer of the first pixel shown in FIG. 8. FIG. 9F is a plan view illustrating an example of the first pixel from among the pixels shown in FIG. 7. FIG. 10 is an enlarged plan view of the first region A1 shown in FIG. 9F. A structure of the pixel is illustrated in FIG. 10 based on the light emitting element LD. FIGS. 11A and 11B are sectional views illustrating an example of the first pixel taken along the lines I-I' and II-II' shown in FIG. 8.

First, referring to FIG. 7, the region AA may include a first pixel PXL1 (or first pixel area PXA1), a second pixel PXL2 (or second pixel area PXA2), and a third pixel PXL3 (or third pixel area PXA3). The first pixel PXL1, the second pixel PXL2, and the third pixel PXL3 may together form (or constitute) one unit pixel PXL.

In some embodiments, the first, second, and third pixels PXL1, PXL2, and PXL3 may emit lights of different colors. In an example, the first pixel PXL1 may be a red pixel which emits red light, the second pixel PXL2 may be a green pixel which emits green light, and the third pixel may be a blue pixel which emits blue light. However, the colors, kind, and/or number of pixels constituting the unit pixel are not particularly limited. In an example, the color of light emitted from each of the pixels may be variously changed. In some embodiments, the first, second, and third pixels PXL1, PXL2, and PXL3 may emit light of the same color. For example, the first, second, and third pixels PXL1, PXL2, and PXL3 may be blue pixels which emit blue light.

The first pixel PXL1, the second pixel PXL2, and the third pixel PXL3 are identical or substantially similar to one another. Therefore, hereinafter, the first pixel PXL1 will be described as an example.

Referring to FIGS. 8 and 11A, the first pixel PXL1 (or the base layer SUB) may have a first area A1 located at a central portion of the first pixel area PXA1 and a second area A2 surrounding the first area A1.

The first pixel PXL1 may include a first conductive layer BML, a buffer layer BFL, a semiconductor layer, a first insulating layer GI, a second conductive layer GAT, a second insulating layer ILD1, a third conductive layer SD1, a third insulating layer ILD2, a fourth conductive layer SD2, and a fourth insulating layer (e.g., a protective layer) PW.

As shown in FIG. 11A, the first conductive layer BML, the buffer layer BFL, the semiconductor layer, the first insulating layer GI, the second conductive layer GAT, the second insulating layer ILD1, the third conductive layer SD1, the third insulating layer ILD2, the fourth conductive layer SD2, and the fourth insulating layer PW may be sequentially stacked on the base layer SUB. In addition, the first conductive layer BML, the semiconductor layer, the second conductive layer GAT, the third conductive layer SD1, and the fourth conductive layer SD2 may be provided at only the second area A2 of the base layer SUB and may not overlap (or extend into) the first area A1.

The first conductive layer BML may be disposed at the second area A2 of the base layer SUB and includes a back gate electrode BGE, a first capacitor electrode Cst_E1, and a horizontal sensing line SENL_H.

As shown in FIGS. 8 and 9A, the back gate electrode BGE may be located at a lower side of the first area A1 on a plane and may entirely cover a first transistor M1, which will be described in more detail below. The back gate electrode BGE may be substantially identical to the back gate electrode described above with reference to FIG. 6 and may form a back gate electrode of the first transistor M1.

The first capacitor electrode Cst_E1 may extend in a second direction DR2 from the back gate electrode BGE and may be disposed at a right side of the first area A1 on a plane. The first capacitor electrode Cst_E1 may form the other electrode of the storage capacitor Cst described above with reference to FIG. 6.

The horizontal sensing line SENL_H may be spaced apart from the back gate electrode BGE and may be disposed at the lowermost side of the first pixel area PXA1 on a plane. The horizontal sensing line SENL_H may extend in a first direction DR1 and may extend across the first pixel area PXA1, the second pixel area PXA2, and the third pixel area PXA3. The first pixel PXL, the second pixel PXL2, and the third pixel PXL3 may be connected to one (e.g., the same) horizontal sensing line SENL_H.

The first conductive layer BML may include at least one metal selected from molybdenum (Mo), aluminum (Al), platinum (Pt), palladium (Pd), silver (Ag), magnesium (Mg), gold (Au), nickel (Ni), neodymium (Nd), iridium (Ir), chromium (Cr), titanium (Ti), tantalum (Ta), tungsten (W), and copper (Cu). The first conductive layer BML may have a single- or multi-layered structure.

Referring back to FIG. 11A, the buffer layer BFL may be disposed on the entire surface of the base layer SUB. The buffer layer BFL may prevent (or substantially prevent) diffusion of impurity ions and penetration of moisture and/or external air and may perform a surface planarization function. The buffer layer BFL may include silicon nitride, silicon oxide, silicon oxynitride, or the like. The buffer layer BFL may be omitted according to a kind of (e.g., the material of) the base layer SUB, a process condition, or the like.

The semiconductor layer may be disposed on the buffer layer BFL (or the base layer SUB when the buffer layer BFL is omitted). The semiconductor layer may be an active layer forming channels of the first to third transistors M1, M2, and M3.

The semiconductor layer may include first to third semiconductor patterns ACT1, ACT2, and ACT3 spaced apart from each other.

Figure 9B:
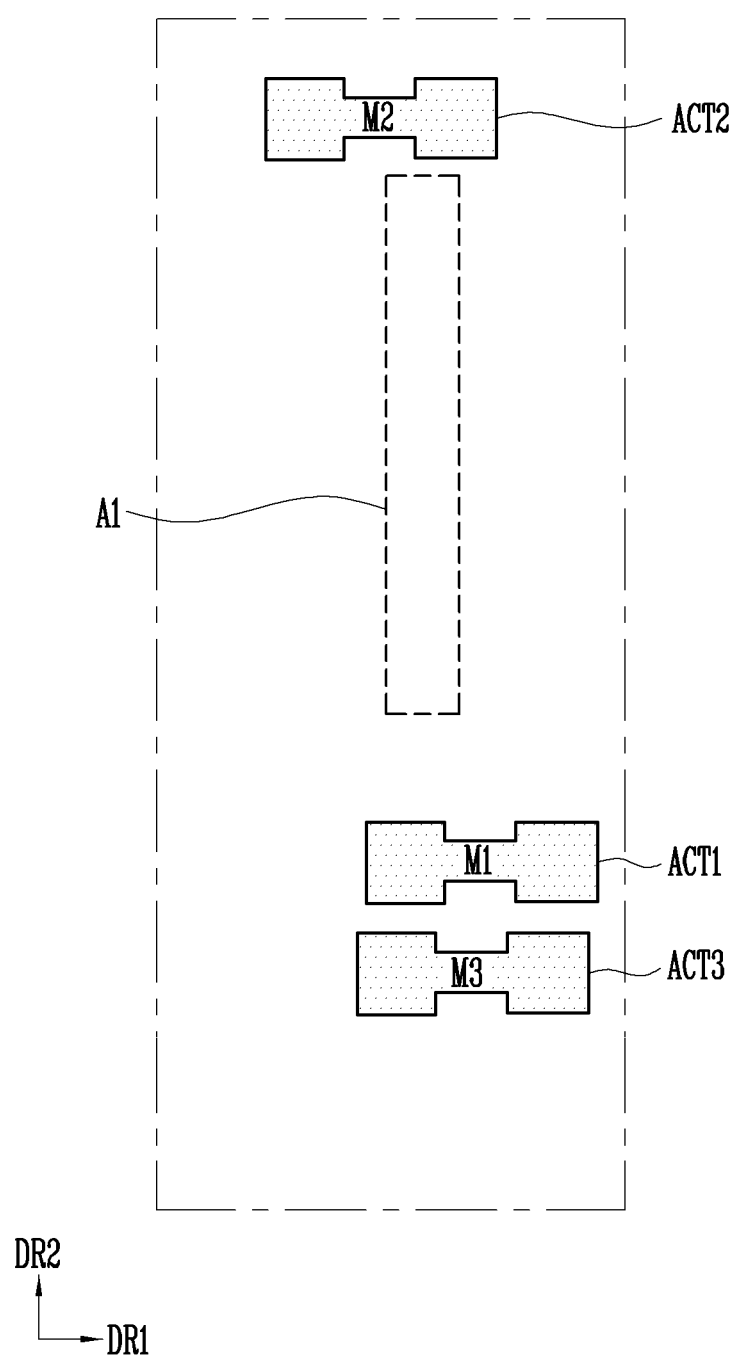

Referring to FIGS. 8 and 9B, the first semiconductor pattern ACT1 may be located at the lower side of the first area A1 on a plane and may form a channel of the first transistor M1.

The second semiconductor pattern ACT2 may be located at an upper side of the first area A1 on a plane and may form a channel of the second transistor M2. The second semiconductor pattern ACT2 may be adjacent to an upper side (e.g., an upper edge) of the first area A1 and may define the upper side of the first area A1.

The third semiconductor pattern ACT3 may be located at the lower side of the first area A1 on a plane. The third semiconductor pattern ACT3 may be located at a lower side of the first semiconductor pattern ACT1 and may form a channel of the third transistor M3.

Each of the first to third semiconductor patterns ACT1, ACT2, and ACT3 may include a source region and a drain region, which respectively contact a first transistor electrode (or source electrode) and a second transistor electrode (or drain electrode). A region between the source region and the drain region may be a channel region.

The semiconductor layer may include an oxide semiconductor. The channel region of the semiconductor pattern is a semiconductor pattern undoped with an impurity and may be an intrinsic semiconductor. The source region and the drain region may be semiconductor patterns doped with an impurity, for example, an n-type impurity. In some embodiments, the semiconductor layer may include a silicon semiconductor. For example, the semiconductor layer may be a semiconductor pattern including (or made of) poly-silicon, amorphous silicon, low temperature poly-silicon (LTPS), etc.

Referring back to FIG. 11A, the first insulating layer (e.g., gate insulating layer) GI may be disposed on the semiconductor layer and the buffer layer BFL (or the base layer SUB). The first insulating layer GI may be disposed (e.g., roughly disposed) throughout the entire surface of the base layer SUB. The first insulating layer GI may be a gate insulating layer having a gate insulating function.

The first insulating layer GI may include an inorganic insulating material, such as a silicon compound or a metal oxide. For example, the first insulating layer GI may include silicon oxide, silicon nitride, silicon oxynitride, aluminum oxide, tantalum oxide, hafnium oxide, zirconium oxide, titanium oxide, or any combination thereof. The first insulating layer GI may be a single layer or a multi-layer structure in which layers including (or made of) different materials are stacked.

The second conductive layer GAT may be disposed on the first insulating layer GI. The second conductive layer GAT may include a scan line SL, a second capacitor electrode Cst_E2, a sensing signal line SSL, and a first power line PL1 (and/or a second power line PL2).

Figure 9C:
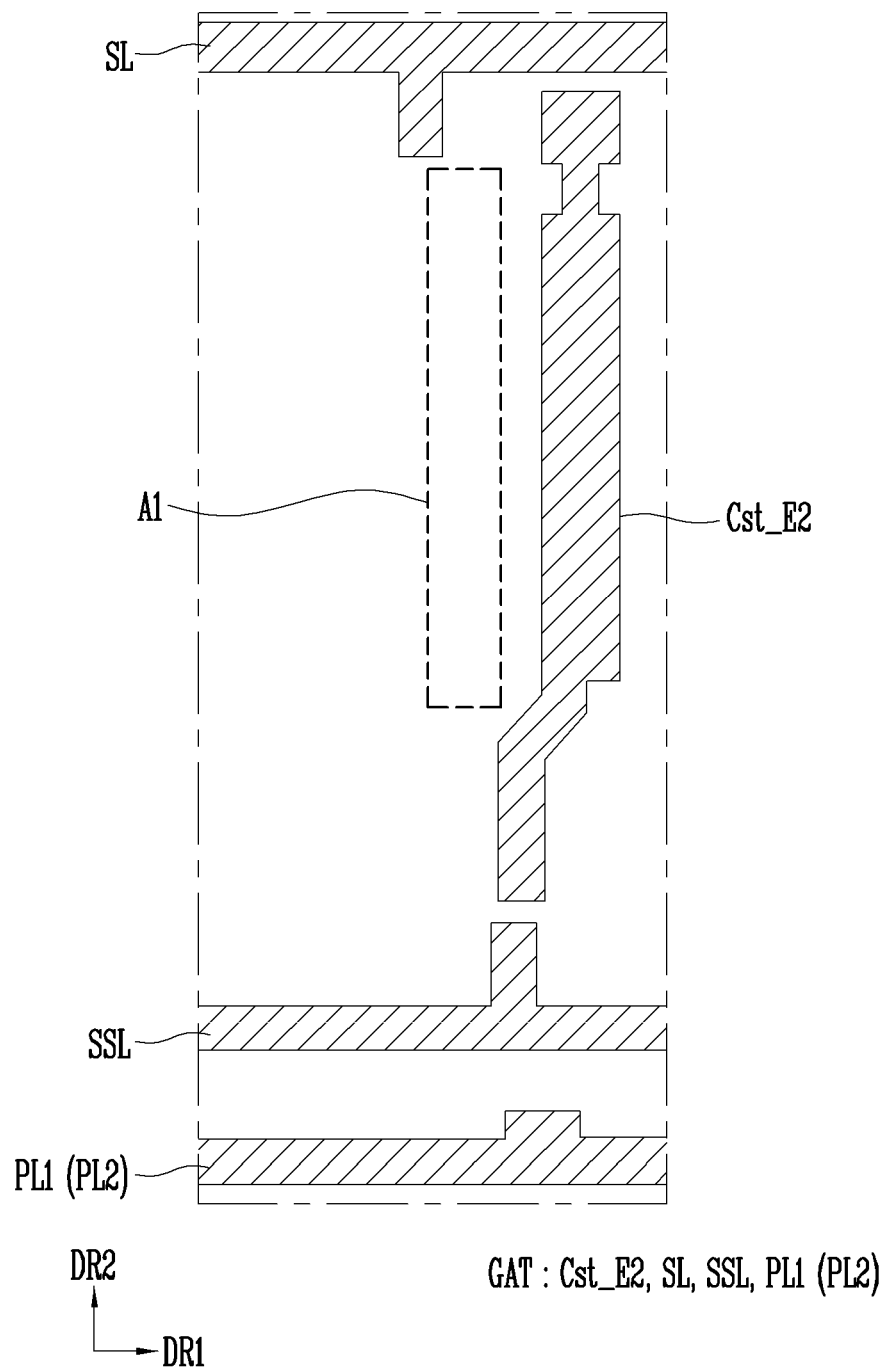

Referring to FIGS. 8 and 9C, the scan line SL may extend in the first direction DR1 and may extend up to another unit pixel area. The scan line SL is located at the upper side of the first area A1 on a plane and may be disposed at the uppermost side of the first pixel area PXA1. The scan line SL may overlap the second semiconductor pattern ACT2 and may form a gate electrode of the second transistor M2.

The second capacitor electrode Cst_E2 may extend in the second direction DR2 and may be disposed at the right side of the first area A1 on a plane. The second capacitor electrode Cst_E2 may overlap the first capacitor electrode Cst_E1 and may form one electrode of the storage capacitor Cst (see, e.g., FIG. 6). Also, the second capacitor electrode Cst_E2 may overlap the first semiconductor pattern ACT1 and may form a gate electrode of the first transistor M1.

The sensing signal line SSL may extend in the first direction DR1 and may extend up to another unit pixel area. The sensing signal line SSL may be disposed at the lower side of the first area A1 on a plane. The sensing signal line SSL may overlap the third semiconductor pattern ACT3 and may form a gate electrode of the third transistor M3.

The first power line PL1 (and/or the second power line PL2) may extend in the first direction DR1 and may extend up to another unit pixel area. The first power line PL1 (and/or the second power line PL2) may be disposed at the lower side of the first area A1 on a plane and may be disposed at the lowermost side of the first pixel area PXA1.

The first power line (e.g., the first horizontal power line) PL1 and the second power line (e.g., the second horizontal power line) PL2 (see, e.g., FIG. 6) may be alternately and repeatedly disposed along the second direction DR2. For example, the first power line PL1 may be disposed at a lower portion of the first pixel area PXA1, and the second power line PL2 may be located outside the first pixel area PXA1 while being adjacent to an upper portion of the first pixel area PXA1.

The first power line PL1 and the second power line PL2 may include at least one metal selected from molybdenum (Mo), aluminum (Al), platinum (Pt), palladium (Pd), silver (Ag), magnesium (Mg), gold (Au), nickel (Ni), neodymium (Nd), iridium (Ir), chromium (Cr), titanium (Ti), tantalum (Ta), tungsten (W), and copper (Cu). The first power line PL1 and the second power line PL2 may have a single- or multi-layered structure.

Referring back to FIG. 11A, the second insulating layer (e.g., the interlayer insulating layer) ILD1 may be disposed over the second conductive layer GAT and may be disposed (e.g., roughly disposed) throughout the entire surface of the base layer SUB. The second insulating layer ILD1 may be an interlayer insulating layer that insulates the second conductive layer GAT and the third conductive layer SD1 from each other.

The second insulating layer ILD1 may include an inorganic insulating material, such as silicon oxide, silicon nitride, silicon oxynitride, hafnium oxide, aluminum oxide, titanium oxide, tantalum oxide, or zinc oxide. However, the present disclosure is not limited thereto, and the second insulating layer ILD2 may include an organic insulating material, such as polyacrylates resin, epoxy resin, phenolic resin, polyamides resin, unsaturated polyesters resin, polyphenylenethers resin, polyphenylenesulfides resin, or benzocyclobutene (BCB). The second insulating layer ILD1 may be a single layer or may have a multi-layer structure in which layers including (or made of) different materials are stacked.

The third conductive layer SD1 may be disposed on the second insulating layer ILD1. The third conductive layer SD1 may include a third capacitor electrode Cst_E3, a data line, a vertical sensing line SENL_V, and first to fifth bridge patterns BRP1, BRP2, BRP3, BRP4, and BRP5.

Figure 9D:
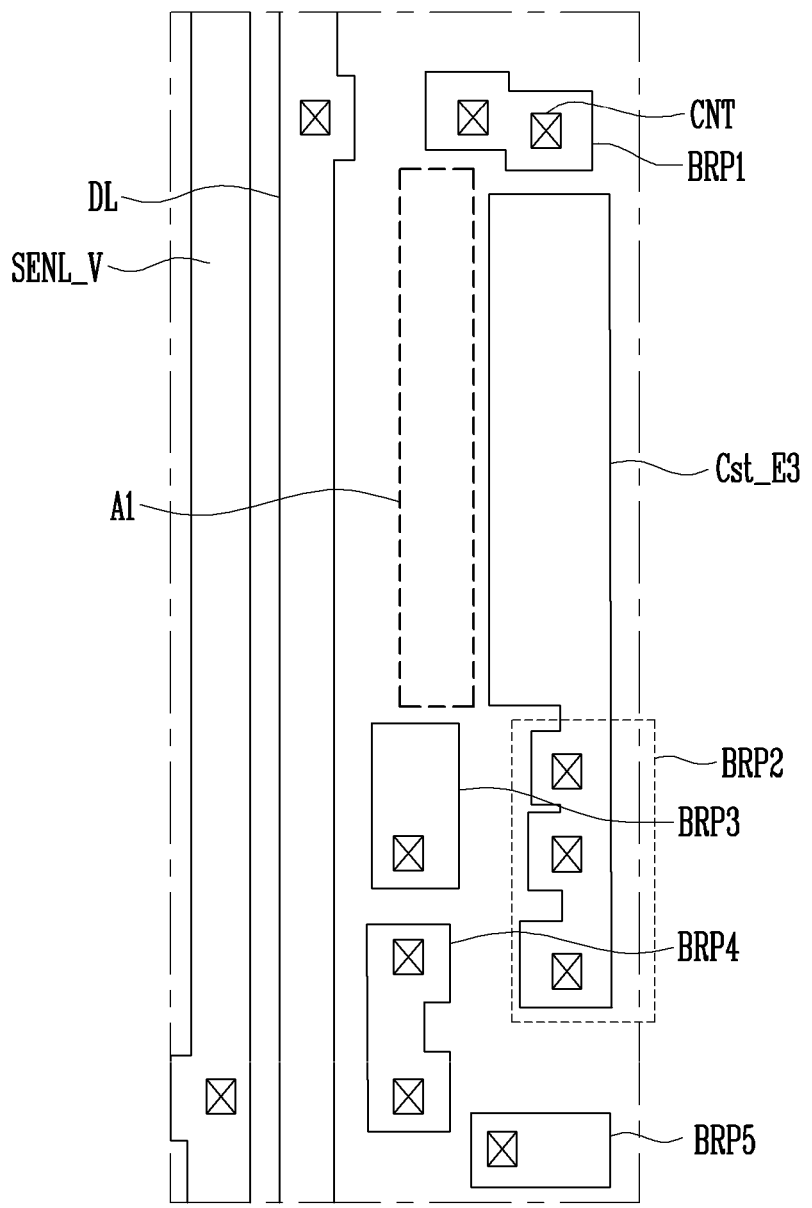

Referring to FIGS. 8 and 9D, the third capacitor electrode Cst_E3 may be disposed to overlap the second capacitor electrode Cst_E2 (and the first capacitor electrode Cst_E1). The third capacitor electrode Cst_E3, along with the first capacitor electrode Cst_E1, may form the other electrode of the storage capacitor Cst. For example, the storage capacitor Cst may include a first capacitor formed by the second capacitor electrode Cst_E2 and the first capacitor electrode Cst_E1 and a second capacitor formed by the second capacitor electrode Cst_E2 and the third capacitor electrode Cst_E3, and the first capacitor and the second capacitor may be connected in parallel to each other. The capacity of the storage capacitor Cst can be sufficiently secured in a limited space outside of the first area A1 through the overlapping structure of the first capacitor electrode Cst_E1, the second capacitor electrode Cst_E2, and the third capacitor electrode Cst_E3.

The data line DL may extend in the second direction DR2 and may extend up to another unit pixel area. The data line DL may be disposed at a left side of the first area A1. The data line DL may overlap a partial region of the second semiconductor pattern ACT2 (or the source region of the second transistor M2) and may be connected to the partial region of the second semiconductor pattern ACT2 through a contact opening (e.g., a contact hole) CNT. A portion of the data line DL may form the first transistor electrode of the second transistor M2.

The vertical sensing line SENL_V may extend in the second direction DR2 and may extend up to another unit pixel area. The vertical sensing line SENL_V may be disposed at the left side of the first area A1 (and the data line DL1) and may be disposed for every unit pixel including the first to third pixels PXL1, PXL2, and PXL3. The vertical sensing line SENL_V may overlap the horizontal sensing line SENL_H and may be connected to the horizontal sensing line SENL_H exposed through the contact opening CNT.

The first bridge pattern BRP1 may be disposed at the upper side of the first area A1. The first bridge pattern BRP1 may overlap a partial region of the second semiconductor pattern ACT2 (or the source region of the second transistor M2), may be connected to the partial region of the second semiconductor pattern ACT2 that is exposed through a contact opening (e.g., a contact hole) CNT, and may form the second transistor electrode of the second transistor M2. Also, the first bridge pattern BRP1 may overlap the second capacitor electrode Cst_E2 and may be connected to the second capacitor electrode Cst_E2 through a contact opening (e.g., a contact hole) CNT. Therefore, the first transistor electrode of the first transistor M1 may be connected to the second capacitor electrode Cst_E2 (i.e., the other electrode of the storage capacitor Cst (see, e.g., FIG. 6)).

The second bridge pattern BRP2 may extend downward from the third capacitor electrode Cst_E3 and may overlap a partial region of the first semiconductor pattern ACT1 (or the drain region of the first transistor M1) and a partial region of the third semiconductor pattern ACT3 (or the source region of the third transistor M3). The second bridge pattern BRP2 may be connected to the partial region of the first semiconductor pattern ACT1 that is exposed through a contact opening (e.g., a contact hole) CNT and may form the first transistor electrode of the first transistor M1. Also, the second bridge pattern BRP2 may be connected to the partial region of the third semiconductor pattern ACT3 that is exposed through a contact opening (e.g., a contact hole) CNT and may form the first transistor electrode of the third transistor M3.

Also, the second bridge pattern BRP2 may be connected to the first capacitor electrode Cst_E1, which is exposed through a contact opening (e.g., a contact hole) CNT. The second bridge pattern BRP2 may be integrally formed with the third capacitor electrode Cst_E3. Therefore, the third capacitor electrode Cst_E3 may be connected to the first capacitor electrode Cst_E1 and may form the other electrode of the storage capacitor Cst (see, e.g., FIG. 6).

The third bridge pattern BRP3 may be disposed at the lower side of the first area A1, may overlap a partial region of the first semiconductor pattern ACT1 (or the drain region of the first transistor M1), may be connected to the partial region of the first semiconductor pattern ACT1 that is exposed through a contact opening (e.g., a contact hole) CNT, and may form the second transistor electrode of the first transistor M1.

The fourth bridge pattern BRP4 may overlap a partial region of the third semiconductor pattern ACT3 (or the drain region of the third transistor M3), may be connected to the partial region of the third semiconductor pattern ACT3 that is exposed through a contact opening (e.g., a contact hole) CNT, and may form the second transistor electrode of the third transistor M3. Also, the fourth bridge pattern BRP4 may overlap the horizontal sensing line SENL_H and may be connected to the horizontal sensing line SENL_H through a contact opening (e.g., a contact hole) CNT. Therefore, the third transistor M3 may be connected to the vertical sensing line SENL_V through the horizontal sensing line SENL_H.

The fifth bridge pattern BRP5 may overlap the first power line PL1 (and/or the second power line PL2) and may be connected to the first power line PL1 (and/or the second power line PL2) through a contact opening (e.g., a contact hole) CNT.

The third conductive layer SD1 may include at least one metal selected from molybdenum (Mo), aluminum (Al), platinum (Pt), palladium (Pd), silver (Ag), magnesium (Mg), gold (Au), nickel (Ni), neodymium (Nd), iridium (Ir), chromium (Cr), titanium (Ti), tantalum (Ta), tungsten (W), and copper (Cu). The third conductive layer SD1 may have a single- or multi-layered structure.

Referring back to FIG. 11A, the third insulating layer (e.g., the interlayer insulating layer) ILD2 may be disposed over the third conductive layer SD1 and may be disposed (e.g., roughly disposed) throughout the entire surface of the base layer SUB. The third insulating layer ILD2 may be the interlayer insulating layer such that it insulates the third conductive layer SD1 and the fourth conductive layer SD2 from each other.

Similar to the second insulating layer ILD1, the third insulating layer ILD2 may include an inorganic insulating material and may be a single layer or may have a multi-layer structure in which layers including (or made of) different materials are stacked.

Because a conductive pattern is not disposed in the first area A1 of the base layer SUB, a top surface of the third insulating layer ILD2 in the first area A1 may be flat (or substantially flat). Based on the base layer SUB, a height of the top surface of the third insulating layer ILD2 in the first area A1 may be lower than that of the top surface of the third insulating layer ILD2 in the second area A2.

The fourth conductive layer SD2 may be disposed on the third insulating layer ILD2. The fourth conductive layer SD2 may include a first vertical power line PL1_V, a second vertical power line PL2_V, and a sixth bridge pattern BRP6.

Figure 9E:
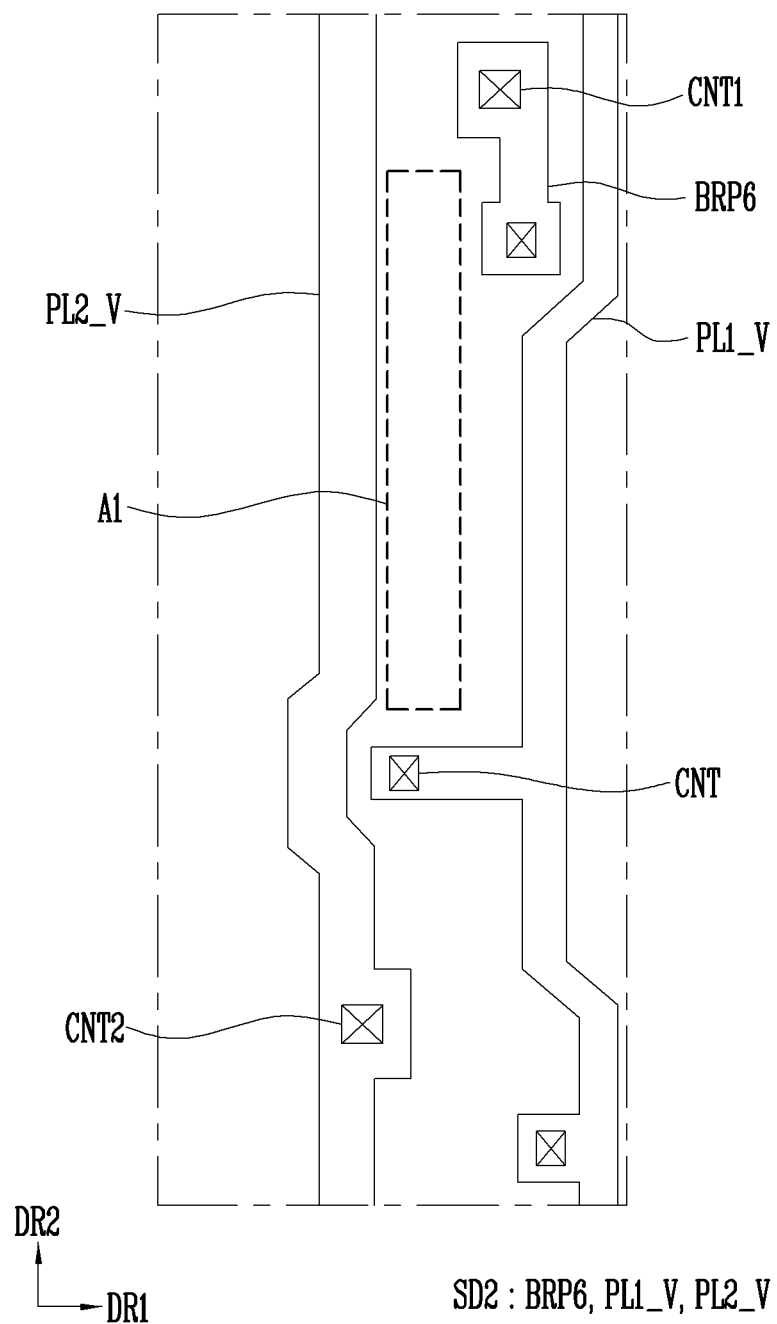
Figure 9F:
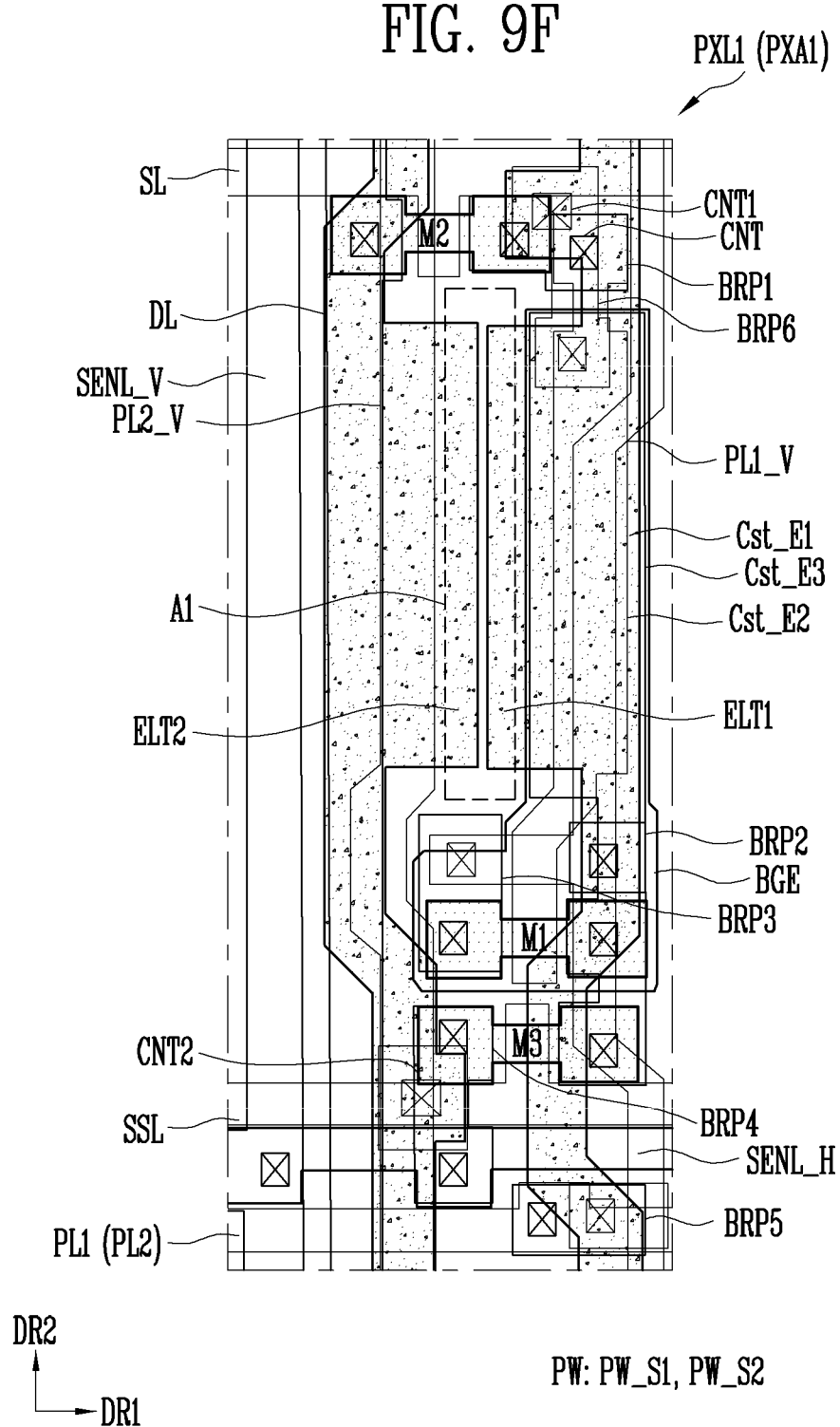
FIG. 9F is a plan view illustrating an example of the first pixel from among the pixels shown in FIG. 7.

Referring to FIGS. 8 and 9E, the first vertical power line PL1_V may extend in the second direction DR2 and may extend up to another unit pixel area. The first vertical power line PL1_V may be disposed at the right side of the first area A1 and may define the right side of the first area A1. The first vertical power line PL1_V may include a protrusion part (e.g., a protrusion) overlapping the third bridge pattern BRP3 and may be connected to the third bridge pattern BRP3 through a contact opening (e.g., a contact hole) CNT (and the protrusion part). Therefore, the first vertical power line PL1_V may be connected to the first transistor M1 through the third bridge pattern BRP3.

Also, the first vertical power line may overlap the fifth bridge pattern BRP5 and may be connected to the fifth bridge pattern BRP5 through a contact opening (e.g., a contact hole) CNT. Therefore, the first vertical power line PL1_V may be connected to the first power line PL1 through the fifth bridge pattern BRP5. Therefore, the first vertical power line PL1_V and the first power line PL1 may have a mesh structure throughout the entire display device.

The second vertical power line PL2_V may extend in the second direction DR2 and may extend up to another unit pixel area. The second vertical power line PL2_V may be disposed at the left side of the first area A1. The second vertical power line PL2_V may be adjacent to the left side of the first area A1 and may define the left side of the first area A1. The second vertical power line PL2_V may be connected to a second electrode ELT2 through a second contact opening (e.g., a second contact hole) CNT2) (see, e.g., FIG. 9F), which will be described below in more detail.

The sixth bridge pattern BRP6 may be disposed at the right side (or upper right side) of the first area A1 and may overlap the third capacitor electrode Cst_E3. The sixth bridge pattern BRP6 may be connected to the third capacitor electrode Cst_E3 that is exposed through a contact opening (e.g., a contact hole) CNT. The sixth bridge pattern BRP6 may be connected to a first electrode ELT1 through a first contact opening (e.g., a first contact hole) CNT1 (see, e.g., FIG. 9F), which will be described below in more detail. Therefore, the first electrode ELT1 (see, e.g., FIG. 9F) may be connected to the first transistor electrode of the first transistor M1 through the sixth bridge pattern BRP6 and the third capacitor electrode Cst_E3 (and the second bridge pattern BRP2).

Referring back to FIG. 11A, the fourth insulating layer PW may be disposed over the fourth conductive layer SD2 and may be disposed (e.g., roughly disposed) on the entire surface of the base layer SUB.

The fourth insulating layer PW may include an insulating layer including an inorganic material and/or an organic material. In an example, first to third bank patterns may include at least one inorganic layer including various suitable inorganic insulating materials, such as silicon nitride ($SiN_x$) or silicon oxide ($SiO_x$). In other embodiments, the fourth insulating layer PW may include at least one organic layer and/or at least one photoresist layer, including various suitable organic insulating materials, or may be configured as a single- or multi-layer insulator including organic/inorganic materials. For example, the fourth insulating layer PW may be variously modified to have different suitable materials.

In some embodiments, the fourth insulating layer PW may include an opening exposing the third insulating layer ILD2 in the first area A1.

As shown in FIG. 10, the fourth insulating layer PW may include an opening which accords with (e.g., corresponds with) the first area A1 and may surround the first area A1 on a plane (e.g., may surround a periphery of the first area A1). The first area A1 may be defined by the fourth insulating layer PW.

A width (e.g., a width in the first direction DR1) of the opening in the fourth insulating layer PW may be longer than a length (e.g., the length L in FIGS. 1A to 4B) of the light emitting element LD.

In an embodiment, the fourth insulating layer PW may have a section having a trapezoidal shape having a width that narrows as it approaches the top thereof in a first opening (e.g., a portion adjacent to the first area A1). The fourth insulating layer PW may have an inclined surface at a side surface adjacent to the first area A1. However, the shape of the fourth insulating layer PW is not limited thereto, and the fourth insulating layer PW may have a section having a semicircular or semi-elliptical shape having a width that narrows as it approaches the top thereof. The fourth insulating layer PW may have a curved surface at a side surface adjacent to the first area A1. For example, in the present disclosure, the shape of the fourth insulating layer PW is not particularly limited and may be variously, suitably modified.

In an embodiment, the fourth insulating layer PW may be a reflective member. In an example, the fourth insulating layer PW along with the first electrode ELT1 and the second electrode ELT2, which are provided on the top thereof, may act as a reflective member which improves the optical efficiency of the first pixel PXL1 (or the pixels) by introducing light emitted from each light emitting element LD in a desired direction.

Referring back to FIG. 11A, the first electrode ELT1 and the second electrode ELT2 may be disposed on the fourth insulating layer PW. The first electrode ELT1 and the second electrode ELT2 may be disposed in the first area A1 and spaced apart from each other.

The first electrode ELT1 and the second electrode ELT2 may have a shape corresponding to that of the fourth insulating layer PW. For example, the first electrode ELT1 and the second electrode ELT2 may protrude in a thickness direction (e.g., a third direction DR3) while respectively having inclined surfaces or curved surfaces corresponding to the fourth insulating layer PW (e.g., corresponding to a first part PW S1 and a second part PW S2 of the fourth insulating layer PW).

Referring to FIG. 9F, the first electrode ELT1 may extend (e.g., may roughly extend) in the second direction DR2 and may be disposed at the right side of the first area A1. The first electrode ELT1 may overlap the sixth bridge pattern BRP6 and may be connected to the sixth bridge pattern BRP6 through the first contact opening CNT1, which exposes the sixth bridge pattern BRP6. Therefore, the first electrode ELT1 may be connected to the first transistor electrode of the first transistor M1 through the sixth bridge pattern BRP6 and the third capacitor electrode Cst_E3 (and the second bridge pattern BRP2).

The first electrode ELT1 may include a first protrusion part (e.g., a first protrusion) protruding in the first direction DR1 in the first area A1. A length of the first protrusion part in the second direction DR2 may be similar to that of the first area A1 in the second direction DR2. For example, the length of the first protrusion part in the second direction DR2 may be less than that of the first area A1 in the second direction DR2.

The second electrode ELT2 may extend (e.g., may roughly extend) in the second direction DR2 and may be disposed at the left side of the first area A1. Also, the second electrode ELT2 may extend up to another pixel area.

The second electrode ELT2 may overlap the second vertical power line PL2_V and may be connected to the second vertical power line PL2_V through the second contact opening CNT2, which exposes the second vertical power line PL2_V.

The second electrode ELT2 may include a second protrusion part (e.g., a second protrusion) protruding in the first direction DR1 in the second area A2. The second protrusion part may face the first protrusion part of the first electrode ELT1 and may be spaced apart from the first protrusion part of the first electrode ELT1. A length of the second protrusion part in the second direction DR2 may be similar to that of the first area A1 in the second direction DR2. For example, the length of the second protrusion part in the second direction DR2 may be equal to that of the first protrusion part of the first electrode ELT1 in the second direction DR2.

Each of the first and second electrodes ELT1 and ELT2 may include at least one conductive material. In an example, each of the first and second electrodes ELT1 and ELT2 may include at least one material among a metal, such as Ag, Mg, Al, Pt, Pd, Au, Ni, Nd, Ir, Cr, Ti, or any alloy thereof, a conductive oxide, such as ITO, IZO, ZnO or ITZO, and a conductive polymer, such as PEDOT, but the present disclosure is not limited thereto.

Also, each of the first and second electrodes ELT1 and ELT2 may be provided in a single layer or as a multi-layer structure. In an example, each of the first and second electrodes ELT1 and ELT2 may include at least one reflective electrode layer. Also, each of the first and second electrodes ELT1 and ELT2 may selectively further include at least one of at least one transparent electrode layer disposed on the top and/or the bottom of the reflective electrode layer and at least one conductive capping layer covering the top of the reflective electrode layer and/or the transparent electrode layer.

In some embodiments, the reflective electrode layer of each of the first and second electrodes ELT1 and ELT2 may be made of a conductive material having a uniform reflexibility. In an embodiment, the reflective electrode layer may include at least one metal, such as Ag, Mg, Al, Pt, Pd, Au, Ni, Nd, Ir, Cr, and alloys thereof, but the present disclosure is not limited thereto. That is, the reflective electrode layer may be made of various suitable reflective conductive materials. When each of the first and second electrodes ELT1 and ELT2 includes the reflective electrode layer, the first and second electrodes ELT1 and ELT2 may allow light emitted from both ends (e.g., the first and second end portions EP1 and EP2) of each of the light emitting elements LD to further advance in a direction in which an image is displayed (e.g., a front direction). For example, when the first and second electrodes ELT1 and ELT2 are disposed to face the first and second end portions EP1 and EP2 of each of the light emitting elements LD while having an inclined surface or curved surface corresponding to the shape of the fourth insulating layer PW (e.g., the shape of a side surface in the first area A1), light emitted from the first and second end portions EP1 and EP2 of each of the light emitting elements LD may be reflected by the first and second electrodes ELT1 and ELT2 to further advance in a front direction of the display panel PNL (see, e.g., FIG. 5) (e.g., an upper direction of the base layer SUB). Accordingly, light extraction efficiency of the light emitting elements LD may be improved.

In addition, the transparent electrode layer of each of the first and second electrodes ELT1 and ELT2 may include (or may be made of) various suitable transparent electrode materials. In an example, the transparent electrode layer may include ITO, IZO or ITZO, but the present disclosure is not limited thereto. In an embodiment, each of the first and second electrodes ELT1 and ELT2 may have a triple-layer structure including a stacked structure of ITO/Ag/ITO. As described above, when each of the first and second electrodes ELT1 and ELT2 is provided as a multi-layer structure including a plurality of (e.g., at least two) layers, a voltage drop caused by RC delay can be reduced or minimized. Accordingly, a desired voltage can be effectively transferred to the light emitting elements LD.

Additionally, when each of the first and second electrodes ELT1 and ELT2 includes the conductive capping layer covering the reflective electrode layer and/or the transparent electrode layer, the reflective electrode layer, etc. of each of the first and second electrodes ELT1 and ELT2 may not be damaged due to a defect occurring in a fabricating process of the pixel PXL, etc. However, the conductive capping layer may be selectively included in the first and second electrodes ELT1 and ELT2. In some embodiments, the conductive capping layer may be omitted. Also, the conductive capping layer may be considered as a component of each of the first and second electrodes ELT1 and ELT2 or may be considered as a separate component disposed on each of the first and second electrodes ELT1 and ELT2.

A fifth insulating layer INS1 may be disposed on areas of (e.g., on portions of) the first and second electrodes ELT1 and ELT2. For example, the fifth insulating layer INS1 may be formed to cover (or partially cover) the curved portions the first and second electrodes ELT1 and ELT2 and may include openings exposing other areas (e.g., flat portions) of the first and second electrodes ELT1 and ELT2.

In an embodiment, the fifth insulating layer INS1 may be primarily formed to entirely cover the first and second electrodes ELT1 and ELT2. After the light emitting elements LD are supplied and aligned on the fifth insulating layer INS1, the fifth insulating layer INS1 may be partially opened (or removed) to expose the first and second electrodes ELT1 and ELT2 at first and second contact portions. In another embodiment, after the supply and alignment of the light emitting elements LD is completed, the fifth insulating layer INS1 may be patterned in the form of individual patterns locally disposed on the bottom of the light emitting elements LD.

For example, the fifth insulating layer INS1 is interposed between the first and second electrodes ELT1 and ELT2 and the light emitting elements LD and may expose at least one area of each of the first and second electrodes ELT1 and ELT2. The fifth insulating layer INS1 may be formed to cover the first and second electrodes ELT1 and ELT2 after the first and second electrodes ELT1 and ELT2 are formed to prevent (or reduce the change of) the first and second electrodes ELT1 and ELT2 from being damaged in a subsequent process or to prevent or substantially prevent metal from being educed in a subsequent process. Also, the fifth insulating layer INS1 may stably support the light emitting elements LD. In some embodiments, the fifth insulating layer INS1 may be omitted.

The light emitting elements LD may be supplied and aligned in a light emitting area EMA (e.g., the first area A1) in which the fifth insulating layer INS1 is formed. In an example, the light emitting elements LD may be supplied in the light emitting area EMA through an inkjet process or the like and may be aligned between the first and second electrodes ELT1 and ELT2 by an alignment voltage (e.g., a predetermined alignment voltage or an alignment signal) applied to the first and second electrodes ELT1 and ELT2.

A sixth insulating layer INS2 may be disposed over the light emitting elements LD, for example, on the top of the light emitting elements LD aligned between the first and second electrodes ELT1 and ELT2 and may expose the first and second end portions EP1 and EP2 of the light emitting elements LD. For example, the sixth insulating layer INS2 does not cover the first and second end portions EP1 and EP2 of the light emitting elements LD but may be partially disposed on only the top of one area of the light emitting elements LD. The sixth insulating layer INS2 may be formed as an independent pattern, but the present disclosure is not limited thereto. In addition, as shown in FIG. 11B, when a separation space exists between the fifth insulating layer INS1 and the light emitting elements LD before the sixth insulating layer INS2 is formed, the space may be filled by the sixth insulating layer INS2. Accordingly, the light emitting elements LD can be more stably supported.

First and second contact electrodes CNE1 and CNE2 may be disposed on the first and second electrodes ELT1 and ELT2 and the first and second end portions EP1 and EP2 of the light emitting elements LD. In an embodiment, the first and second contact electrodes CNE1 and CNE2 may be disposed in the same layer, as shown in FIG. 11A. The first and second contact electrodes CNE1 and CNE2 may include (or may be formed of) the same conductive material through the same process, but the present disclosure is not limited thereto.

The first and second contact electrodes CNE1 and CNE2 may electrically connect the first and second end portions EP1 and EP2 of the light emitting elements LD to the first and second electrodes ELT1 and ELT2, respectively.

For example, the first contact electrode CNE1 may be disposed on the first electrode ELT1 to contact the first electrode ELT1. In an example, the first contact electrode CNE1 may be disposed to contact the first electrode ELT1 at an area of the first electrode ELT1 that is not covered by the fifth insulating layer INS1. Also, the first electrode CNE1 may be disposed on the first end portion EP1 of at least one light emitting element LD (e.g., of each of a plurality of the light emitting elements LD), which is adjacent to the first electrode ELT1 to contact the first end portion EP1. For example, the first contact electrode CNE1 may be disposed to cover the first end portion EP1 of each of the light emitting elements LD and at least one area of the first electrode ELT1, which corresponds to the light emitting elements LD. Accordingly, the first end portion EP1 of each of the light emitting elements LD may be electrically connected to the first electrode ELT1.

Similarly, the second contact electrode CNE2 may be disposed on the second electrode ELT2 to contact the second electrode ELT2. In an example, the second contact electrode CNE2 may be disposed to be in contact with the second electrode ELT2 at one area of the second electrode ELT2 that is not covered by the fifth insulating layer INS1. Also, the second contact electrode CNE2 may be disposed on the second end portion EP2 of at least one light emitting element LD (e.g., of each of a plurality of light emitting elements LD), which is adjacent to the second electrode ELT2 to contact the second end portion EP2. For example, the second contact electrode CNE2 may be disposed to cover the second end portion EP2 of each of the light emitting elements LD and at least one area of the second electrode ELT2, which corresponds to the light emitting elements LD. Accordingly, the second end portion EP2 of each of the light emitting elements LD may be electrically connected to the second electrode ELT2.

A seventh insulating layer INS3 may be formed and/or disposed on one surface of the base layer SUB, on which the fourth insulating layer PW, the first and second electrodes ELT1 and ELT2, the light emitting elements LD, and the first and second contact electrodes CNE1 and CNE2 are formed, to cover the fourth insulating layer PW, the first and second electrodes ELT1 and ELT2, the light emitting elements LD, and the first and second contact electrodes CNE1 and CNE2. The seventh insulating layer INS3 may include a thin film encapsulation layer including at least one inorganic layer and/or at least one organic layer, but the present disclosure is not limited thereto. In some embodiments, at least one overcoat layer may be further disposed on the top of the seventh insulating layer INS3.

In some embodiments, each of the fifth to seventh insulating layers INS1, INS2, and INS3 may be provided in a single layer or as a multi-layer structure and may include at least one inorganic insulating material and/or at least one organic insulating material. For example, each of the fifth to seventh insulating layers INS1, INS2, and INS3 may include various suitable organic/inorganic insulating materials, including silicon nitride ($SiN_x$), but the material(s) constituting each of the fifth to seventh insulating layers INS1, INS2, and INS3 is not particularly limited. Also, the fifth to seventh insulating layers INS1, INS2, and INS3 may include different insulating materials, but in some embodiments, at least some of the fifth to seventh insulating layers INS1, INS2, and INS3 may include the same insulating material.

As described with reference to FIGS. 7 to 11B, the base layer SUB or the pixel area (e.g., the first pixel area PXA1) may have the first area A1 and the second area A2 surrounding the first area A1, conductive patterns (e.g., a semiconductor pattern, a line, a bridge pattern, and the like) constituting the pixel driving circuit DC (see, e.g., FIG. 6) may be provided in the second area A2, and only insulating layers (e.g., the first to third insulating layers GI, ILD1, and ILD2) may be provided in the first area A1. The first area A1 may be defined by the second vertical power line PL2_V, the second semiconductor pattern ACT2, and a capacitor electrode (e.g., the third capacitor electrode Cst_E3 and/or the first capacitor electrode Cst_E1) (or the first vertical power line PL1_V). Thus, any step difference caused by the conductive patterns does not occur in the first area A1, such that it is unnecessary to form an organic insulating layer which planarizes a surface on which the light emitting element LD is provided (e.g., a top surface of the third insulating layer ILD3). Therefore, a fabricating process of the display device can be further simplified.

Although an embodiment in which the opening of the fourth insulating layer PW may have a section of a trapezoidal shape (e.g., may have a partial trapezoidal shape) and the first and second contact electrodes CNE1 and CNE2 are disposed in the same layer is illustrated in FIGS. 11A and 11B, the present disclosure is not limited thereto.

FIGS. 11C to 11E are sectional views illustrating another example of the first pixel taken along the lines I-I' and II-II' of FIG. 8. Figures corresponding to FIG. 11B are illustrated in FIGS. 11C to 11E.

First, referring to FIG. 11C, the fourth insulating layer PW may have a section of a semicircular or semi-elliptical shape (e.g., a side surface having a curved shape) having a width that narrows as it approaches the top thereof in the opening formed in the first area A1.

Referring to FIG. 11D, the first contact electrode CNE1 may be disposed on the first electrode ELT1 to contact one area of the first electrode ELT1. Also, the first contact electrode CNE1 may be disposed on the first end portion EP1 of the light emitting element to contact the first end portion EP1. The first end portion EP1 of the light emitting element LD may be electrically connected to the first electrode ELT1 by the first contact electrode CNE1.

An eighth insulating layer INS4 may be disposed over the first contact electrode CNE1. In some embodiments, the eighth insulating layer INS4 may cover the sixth insulating layer INS2 and the first contact electrode CNE1.

In some embodiments, like the fifth to seventh insulating layers INS1, INS2, and INS3, the eighth insulating layer INS4 may be provided in a single layer or as a multi-layer structure and may include at least one inorganic insulating material and/or at least one organic insulating material. For example, the eighth insulating layer INS4 may include various suitable organic/inorganic materials, including silicon nitride ($SiN_x$). Also, the eighth insulating layer INS4 may include an insulating material different from that of the fifth to seventh insulating layers INS1, INS2, and INS3 or may include the same insulating material as at least some of the fifth to seventh insulating layers INS1, INS2, and INS3.

The second contact electrode CNE2 may be disposed on the eighth insulating layer INS4. In some embodiments, the second contact electrode CNE2 may be disposed on the second electrode ELT2 to contact one area of the second electrode ELT2. Also, the second contact electrode CNE2 may be disposed on the second end portion EP2 of the light emitting element LD to contact the second end portion EP2. The second end portion EP2 of the light emitting element LD may be electrically connected to the second electrode ELT2 by the second contact electrode CNE2.

In some embodiments, the opening of the fourth insulating layer PW may have various polygonal shapes. In an embodiment, the fourth insulating layer PW (or the first part PW S1 and the second part PW S2 of the fourth insulating layer PW) may have a section of a trapezoidal shape having a width that narrows as it approaches the top thereof, as shown in FIG. 11D. In another example, as shown in FIG. 11E, the fourth insulating layer PW (or the first part PW S1 and the second part PW S2 of the fourth insulating layer PW) may have a surface having a semicircular or semi-elliptical shape (e.g., a side surface having a curved shape) having a width that narrows as it approaches the top thereof.

Figure 12:
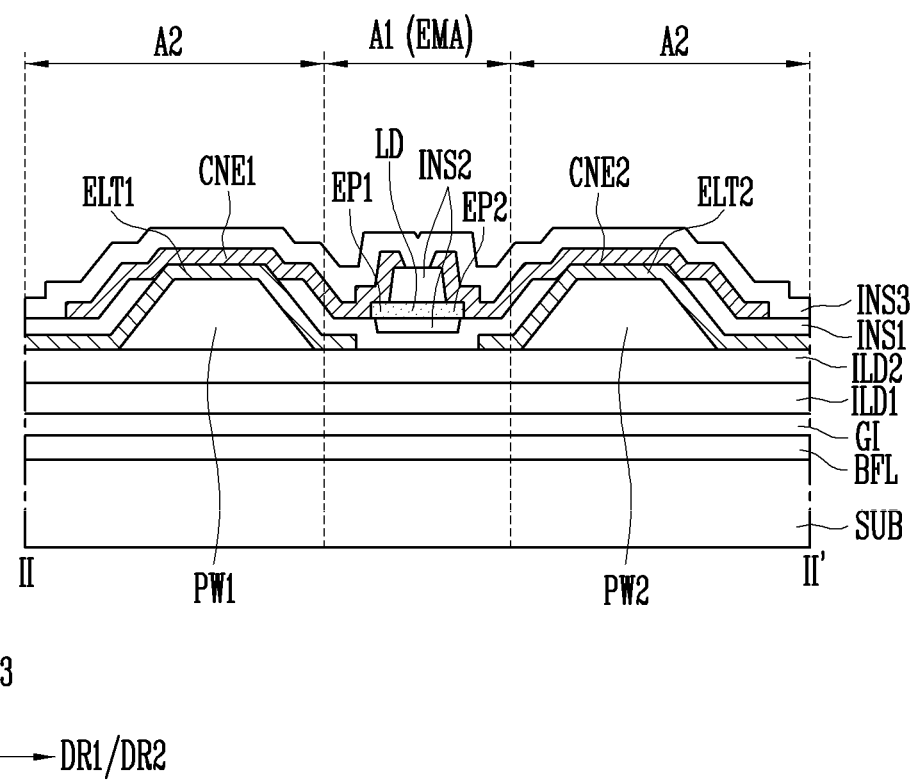
FIG. 12 is a sectional view illustrating another example of the first pixel taken along the line II-II' shown in FIG. 8.

FIG. 12 is a sectional view illustrating another example of the first pixel taken along the line II-II' of FIG. 8. FIG. 12 corresponds to FIG. 11A. For convenience of description, a lower configuration of the fourth insulating layer PW (see, e.g., FIG. 11A) is schematically illustrated. Further, redundant descriptions between these figures may be omitted.

A first pixel PXL1 shown in FIG. 12 may be substantially similar to the first pixel PXL1 shown in FIG. 11A, except that the first pixel PXL1 shown in FIG. 12 includes a first bank pattern (e.g., a first bank pattern) PW1 and a second bank pattern PW2 (e.g., a second bank pattern) PW2, instead of (or in place of) the fourth insulating layer PW.

The first bank pattern PW1 may be disposed below the first electrode ELT1, and the first electrode ELT1 may overlap the first bank pattern PW1. The second bank pattern PW2 may be disposed below the second electrode ELT2, and the second electrode ELT2 may overlap the second bank pattern PW2. The first and second bank patterns PW1 and PW2 may be disposed to be spaced apart from each other with the first area A1 (e.g., the emission area EMA) interposed therebetween. For example, the first bank pattern PW1 may cover the first vertical power line PL1_V shown in FIG. 9E, and the second bank pattern PW2 may cover the second vertical power line PL2_V shown in FIG. 9E. A third inorganic insulating layer ILD2 may be exposed through a space between the first bank pattern PW1 and the second bank pattern PW2.

Portions of the first and second electrodes ELT1 and ELT2 may protrude upward due to the first and second bank patterns PW1 and PW2. For example, the first electrode ELT1 may be disposed on the first bank pattern PW1 to protrude in a height direction (e.g., a thickness direction) of the base layer SUB due to the first bank pattern PW1, and the second electrode ELT2 may be disposed on the second bank pattern PW2 to protrude in a height direction of the base layer SUB due to the second bank pattern PW2.

In the display device according to the present disclosure, only light emitting elements and insulating layers are provided in a first area (e.g., an emission area) while conductive patterns forming a pixel driving circuit are provided in only a second area surrounding the first area. The first area is defined by power lines and a semiconductor pattern. Thus, any step difference caused by the conductive patterns does not occur in the first area (e.g., occurs or is present outside of the first area); thus, it is unnecessary to form an organic insulating layer which planarizes a surface on which the light emitting element is provided, and a fabricating process of the display device can be further simplified.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present disclosure as set forth in the following claims and their equivalents.

What is claimed is:

1. A display device comprising:
a base layer having a first area and a second area extending at least partially around a periphery of the first area;
conductive patterns in the second area;
an insulating layer covering the conductive patterns in the second area;
a first electrode and a second electrode on the insulating layer, the first electrode and the second electrode being spaced apart from each other in the first area, the first electrode and the second electrode being respectively connected to portions of the conductive patterns through contact openings penetrating the insulating layer;
a plurality of light emitting elements between the first electrode and the second electrode in the first area, the plurality of light emitting elements being connected to the first electrode and the second electrode;
a third electrode on the first electrode and on one end portion of the light emitting elements to contact the first electrode and the one end portion of the light emitting elements; and
a fourth electrode on the second electrode and on the other end portion of the light emitting elements to contact the second electrode and the other end portion of the light emitting elements,
wherein the light emitting elements do not overlap the conductive patterns and the insulating layer.

2. The display device of claim 1, wherein the third electrode and the fourth electrode are formed in the same layer.

3. The display device of claim 1, further comprising an inorganic insulating layer on the base layer,
wherein at least one of the conductive patterns is on the inorganic insulating layer,
wherein the insulating layer comprises a first bank pattern and a second bank pattern, which are spaced apart from each other, and
wherein the inorganic insulating layer is exposed through a space between the first bank pattern and the second bank pattern.

4. The display device of claim 1, wherein the third electrode and the fourth electrode are spaced apart from each other in different layers with another insulating layer therebetween.

5. The display device of claim 1, further comprising an inorganic insulating layer on the base layer,
wherein at least one of the conductive patterns is on the inorganic insulating layer,
wherein the insulating layer has an opening exposing the inorganic insulating layer, and
wherein the light emitting elements are in the opening.

6. The display device of claim 5, wherein the insulating layer is not between the base layer and the light emitting elements.

7. The display device of claim 5, wherein a height of a top surface of the inorganic insulating layer in the first area above the base layer is less than that of the top surface of the inorganic insulating layer in the second area.

8. The display device of claim 5, wherein the inorganic insulating layer comprises a first inorganic insulating layer, a second inorganic insulating layer, and a third inorganic insulating layer, which are sequentially stacked on the base layer, and
wherein the conductive patterns comprise:
a back gate electrode between the base layer and the first inorganic insulating layer, the back gate electrode overlapping a semiconductor pattern;
a gate electrode on the first inorganic insulating layer, the gate electrode overlapping the semiconductor pattern;
a first capacitor electrode on the first inorganic insulating layer, the first capacitor electrode overlapping the back gate electrode;
a second capacitor electrode on the second inorganic insulating layer, the second capacitor electrode being connected to one region of the semiconductor pattern through a contact opening penetrating the second inorganic insulating layer, the second capacitor electrode overlapping the first capacitor electrode; and
a bridge pattern on the third inorganic insulating layer, the bridge pattern being connected to the second capacitor electrode through a contact opening penetrating the third inorganic insulating layer, the bridge pattern being connected to the first electrode through a contact opening penetrating the insulating layer.

9. The display device of claim 8, wherein the back gate electrode and the first capacitor electrode form a first capacitor by overlapping each other, and
wherein the first capacitor electrode and the second capacitor electrode form a second capacitor by overlapping each other.

10. The display device of claim 1, wherein the conductive patterns comprise a first power line and a second power line that are spaced apart from each other along a first direction on a plane, the first power line and the second power line extending in a second direction crossing the first direction,
wherein one of the first power line and the second power line is connected to one of the first electrode and the second electrode, and
wherein at least a portion of the first area is defined by the first power line and the second power line.

11. The display device of claim 10, further comprising a semiconductor pattern connected to at least some of the conductive patterns,
wherein the semiconductor pattern is in the second area with respect to the first area on a plane, and
wherein the other portion of the first area is defined by the semiconductor pattern.

12. The display device of claim 11, wherein each of the first electrode and the second electrode extends in the second direction on a plane and comprises a protrusion protruding into the first area.

13. The display device of claim 12, wherein each of the light emitting elements is a bar type light emitting diode having a size on a nano scale to a micro scale, and
wherein the light emitting elements are arranged along the first direction on a plane.

14. A display device comprising:
a substrate having a plurality of pixel areas, each of the pixel areas has a first area and a second area extending around a periphery of the first area;
conductive patterns comprising a first line and a second line in the second area, the first line and the second line extending in a first direction and being spaced apart from each other in a second direction crossing the first direction;

an insulating layer covering the conductive patterns; and light emitting elements in the first area, the light emitting elements being connected between the first line and the second line, a first electrode and a second electrode extending in the first direction, the first electrode and the second electrode being spaced apart from each other in the first area, a third electrode overlapping the first electrode and one end portion of the light emitting elements to contact the first electrode and the one end portion of the light emitting elements; and a fourth electrode overlapping the second electrode and the other end portion of the light emitting elements to contact the second electrode and the other end portion of the light emitting elements, wherein at least a portion of the first area is defined by the first line and the second line, and wherein the light emitting elements do not overlap either of the insulating layer or the conductive patterns, wherein the light emitting elements are connected between the first electrode and the second electrode, and wherein one of the first line and the second line is connected to one of the first electrode and the second electrode.

15. The display device of claim 14, wherein each of the light emitting elements is a bar type light emitting diode which have a size on a nano scale to a micro scale, and wherein the light emitting elements are arranged along the first direction on a plane.

16. The display device of claim 14, further comprising a transistor in the second area with respect to the first area, the transistor being connected to the other of the first line and the second line, wherein the first area is further defined by the transistor.

* * * * *